US012633355B2

(12) United States Patent
Lien et al.

(10) Patent No.: US 12,633,355 B2
(45) Date of Patent: May 19, 2026

(54) PROGRAM REFRESH FOR ALL LEVELS PROGRAM OPERATION IN A MEMORY DEVICE

(71) Applicant: MICRON TECHNOLOGY, INC., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 18/785,486

(22) Filed: Jul. 26, 2024

(65) Prior Publication Data

US 2026/0031157 A1 Jan. 29, 2026

(51) Int. Cl.
| | |
|---|---|
| *G11C 16/34* | (2006.01) |
| *G11C 16/04* | (2006.01) |
| *G11C 16/08* | (2006.01) |
| *G11C 16/10* | (2006.01) |

(52) U.S. Cl.
CPC ...... *G11C 16/3418* (2013.01); *G11C 16/0483* (2013.01); *G11C 16/08* (2013.01); *G11C 16/10* (2013.01); *G11C 16/3459* (2013.01)

(58) Field of Classification Search
CPC . G11C 16/3418; G11C 16/0483; G11C 16/08; G11C 16/10; G11C 16/3459
See application file for complete search history.

(56) References Cited

U.S. PATENT DOCUMENTS

| | | | | |
|---|---|---|---|---|
| 11,222,694 B1 * | 1/2022 | Bhamidipati | .......... | H10B 41/40 |
| 2023/0092551 A1 * | 3/2023 | Sato | ........................ | G11C 16/10 |
| | | | | 365/189.011 |

* cited by examiner

*Primary Examiner* — Khoa D Doan
(74) *Attorney, Agent, or Firm* — Lowenstein Sandler LLP

(57) ABSTRACT

A memory device includes a memory array including a plurality of wordlines; and at least one string of cells, each cell of the at least one string of cells being addressable by a respective wordline of the plurality of wordlines; and control logic, operatively coupled with the memory array, to perform operations including: initializing a loop of a program refresh operation; causing a set of memory cells addressable by a selected wordline, of the plurality of wordlines, to be programmed during the loop by: causing, during a first time period of a program operation, a seed operation to be performed on the set of memory cells; causing, during a second time period of the program operation, a ramping wordline voltage to be applied to the set of memory cells of the selected wordline; causing, during the second time period, a disconnection of a set of pillars associated with the set of memory cells from a voltage supply and a ground voltage, wherein each pillar corresponds to a respective programming level of a set of programming levels; causing, during a third time period of the program operation, a program pulse to be applied to the set of memory cells, wherein the program pulse programs each programming level of the set of programming levels associated with the set of memory cells; and causing, during a program verify time period of the program operation, a program verify operation performed on the set of memory cells.

20 Claims, 15 Drawing Sheets

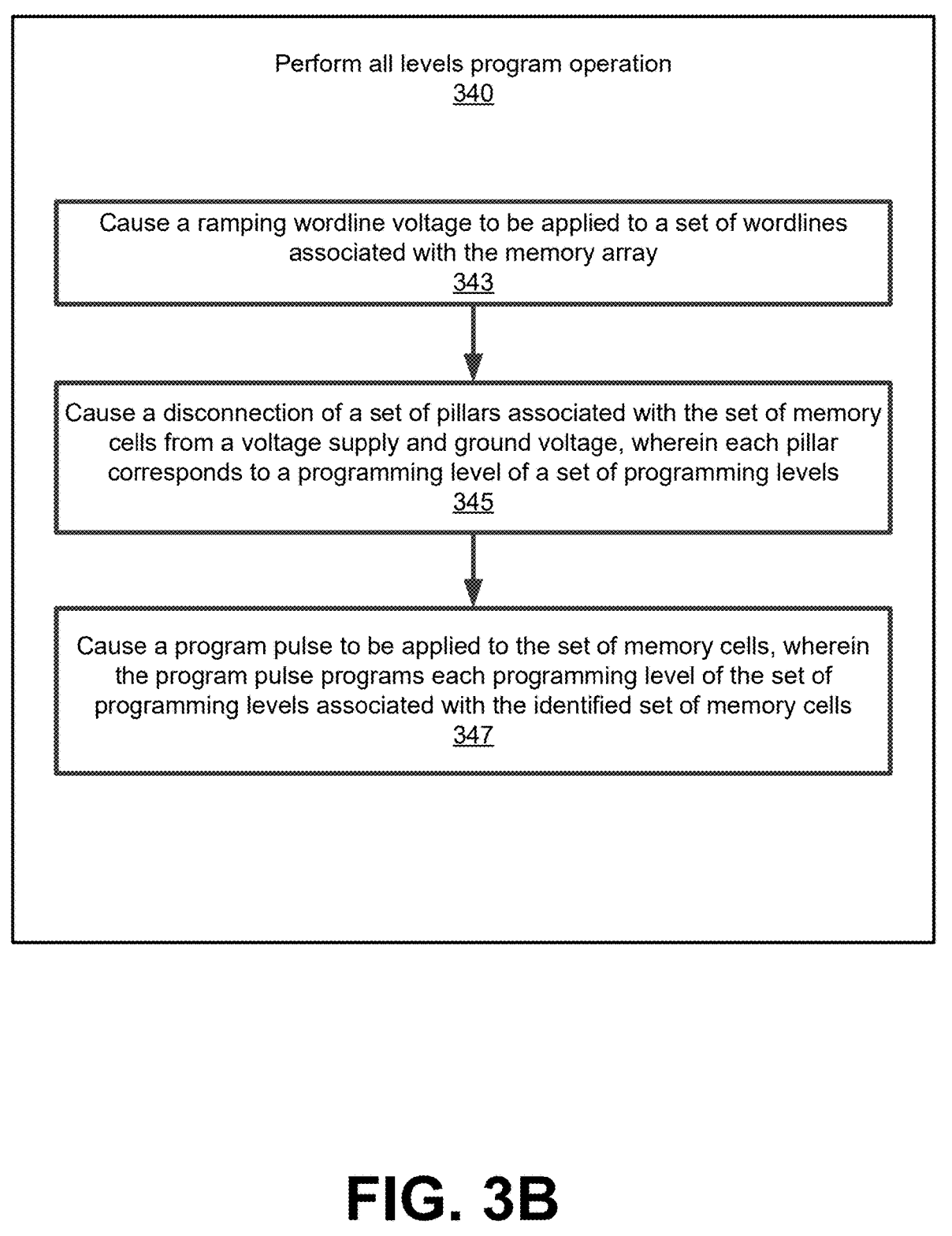

Perform all levels program operation
340

Cause a ramping wordline voltage to be applied to a set of wordlines associated with the memory array
343

Cause a disconnection of a set of pillars associated with the set of memory cells from a voltage supply and ground voltage, wherein each pillar corresponds to a programming level of a set of programming levels
345

Cause a program pulse to be applied to the set of memory cells, wherein the program pulse programs each programming level of the set of programming levels associated with the identified set of memory cells
347

FIG. 3B

700
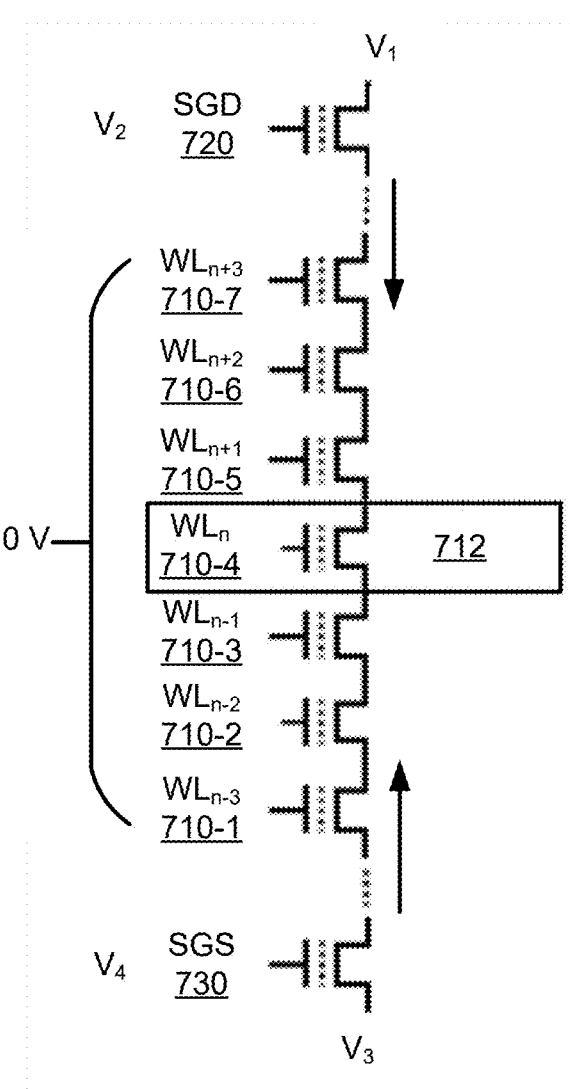
FIG. 7

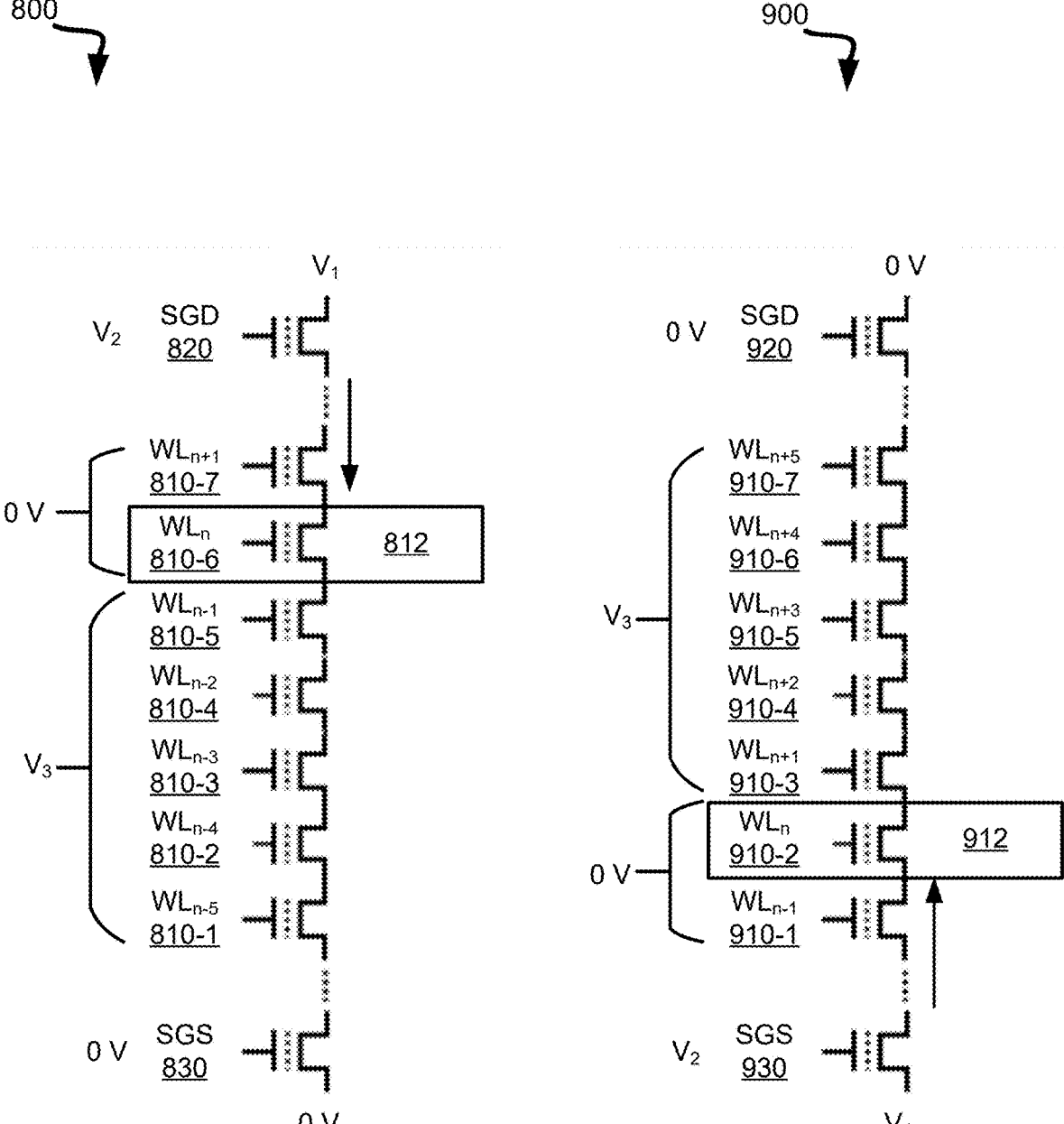
FIG. 8          FIG. 9

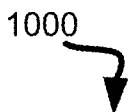
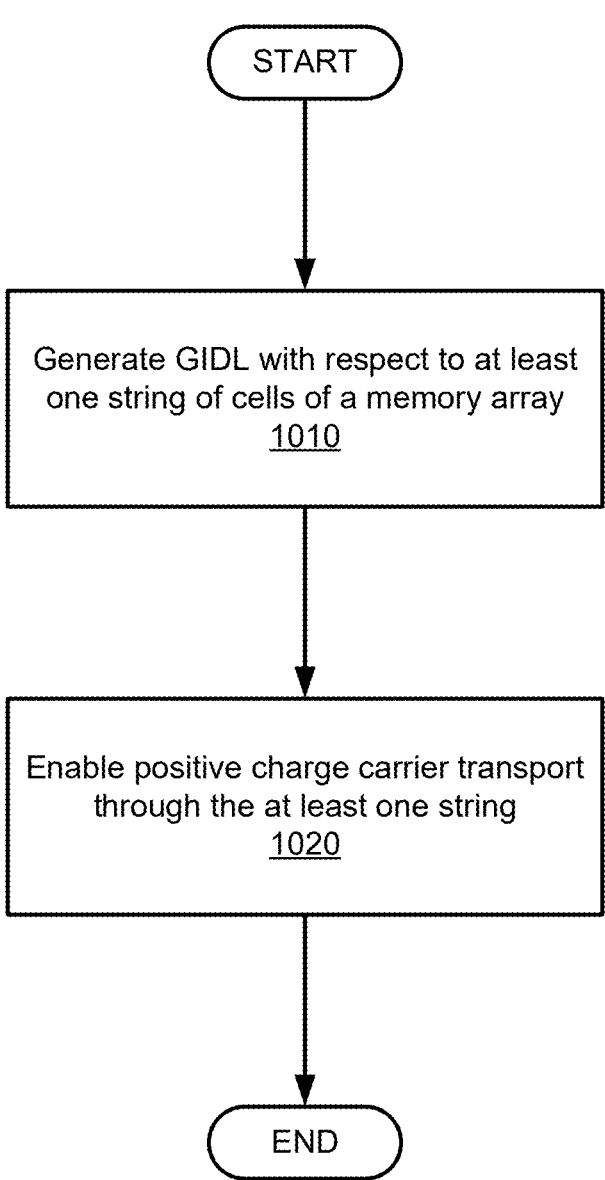
1000
START
Generate GIDL with respect to at least
one string of cells of a memory array
1010
Enable positive charge carrier transport
through the at least one string
1020
END
FIG. 10

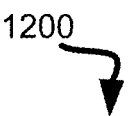
1200
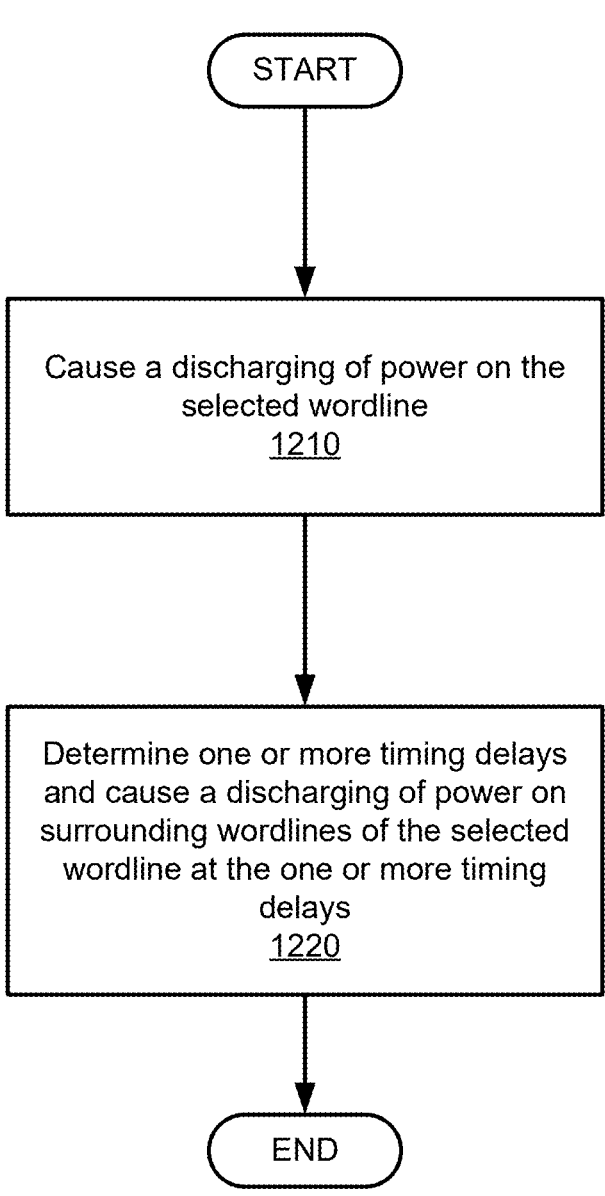
START
Cause a discharging of power on the selected wordline
1210
Determine one or more timing delays and cause a discharging of power on surrounding wordlines of the selected wordline at the one or more timing delays
1220
END
FIG. 12

PROGRAM REFRESH FOR ALL LEVELS PROGRAM OPERATION IN A MEMORY DEVICE

TECHNICAL FIELD

Embodiments of the disclosure relate generally to memory sub-systems, and more specifically, relate to program refresh for all levels program operation in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 3A and 3B are flow diagrams of example methods of implementing program refresh with all levels program operation of a memory device in a memory sub-system in accordance with one or more embodiments of the present disclosure.

FIGS. 7-9 are diagrams illustrating examples of gate-induced drain leakage (GIDL) implemented for portions of an array of memory cells, in accordance with some embodiments of the present disclosure.

FIG. 10 is a flow diagram of an example method for causing gate-induced drain leakage (GIDL) in a memory array, in accordance with some embodiments of the present disclosure.

FIG. 12 is a flow diagram of an example method for causing a staggered discharge operation performed in a memory array, in accordance with some embodiments of the present disclosure.

DETAILED DESCRIPTION

Figure 1A:
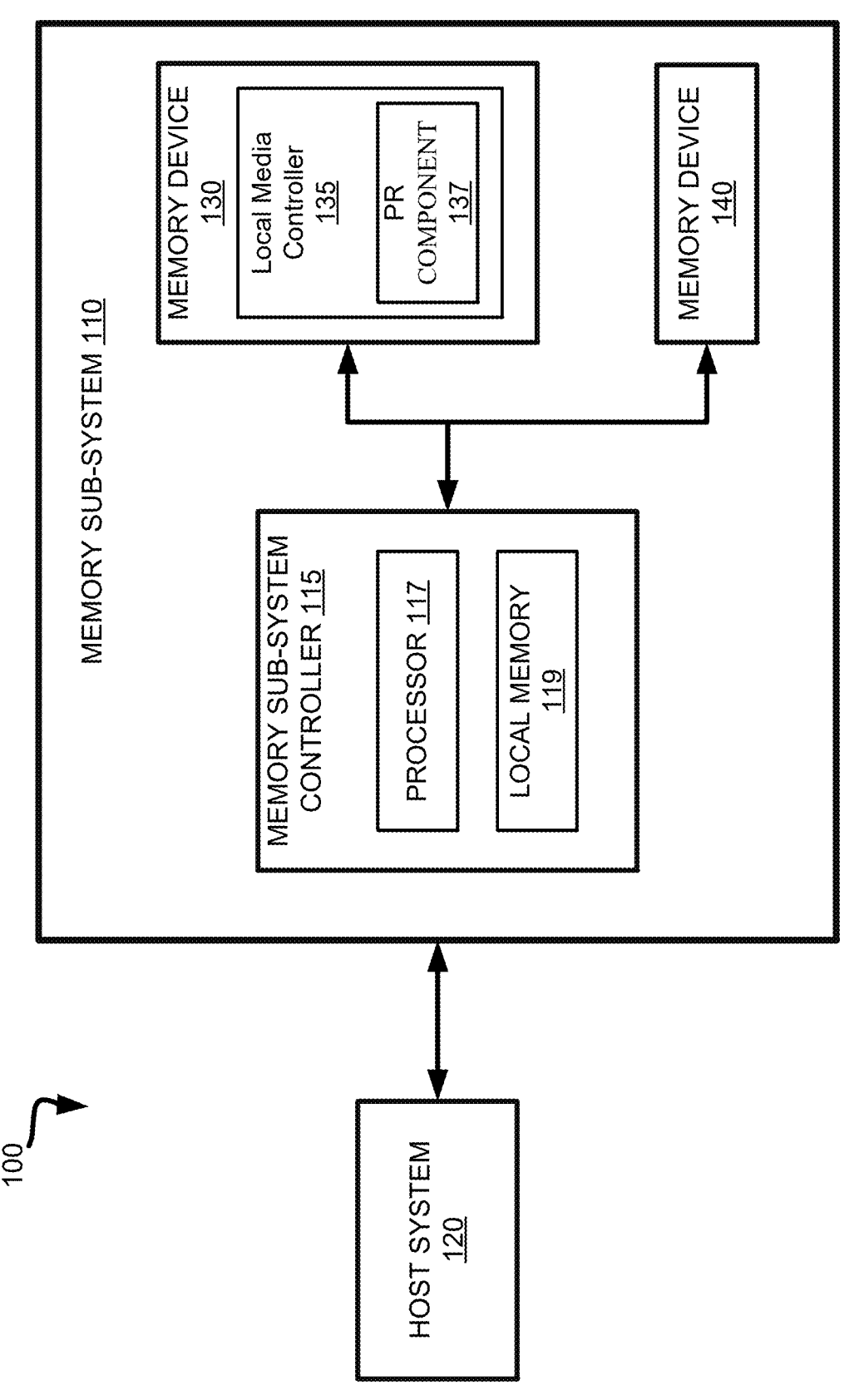
FIG. 1A illustrates an example computing system that includes a memory sub-system in accordance with some embodiments of the present disclosure.

Aspects of the present disclosure are directed to implementing program refresh for all levels program operation in a memory device of a memory sub-system. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. The memory cells are formed onto a silicon wafer in an array of columns (also hereinafter referred to as bitlines) and rows (also hereinafter referred to as wordlines). A wordline can refer to one or more conductive lines of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane. As these processing threads operate independently, the power usage and requirements associated with each processing thread also varies.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain-side and the second side can be a source-side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T) = dW/dV_T$, where dW represents the probability that any given cell has its threshold voltage within the interval $[V_T, V_T + dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. As yet another example, in a QLC cell, there are 16 read windows that exist with respect to the 16 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

There is an inverse relationship between the number of bits per cell stored in a given cell and cost per bit (e.g., QLC cells cost less than TLC cells, TLC cells cost less than MLC cells, MLC cells cost less than SLC cells). Therefore, it may be beneficial to store additional bit(s) per cell within a particular memory device having a particular size. However, since the additional $V_T$ distributions defining the additional bit(s) per cell will share the same $V_T$ window with the previous $V_T$ distributions, it may not be possible in typical memory device implementations to add $V_T$ distributions to achieve increased bit per cell storage. Moreover, as the number of bits per cell increases, less read margin typically exists between adjacent $V_T$ distributions.

In some memory devices, after manufacturing of the memory device, there is a need to increase RWB to condense or tighten the $V_T$ distributions to store a same number of bits per cell (i.e., without requiring additional $V_T$ distributions). In some memory devices, a program refresh operation can "touch up" the pre-stored data in a memory device to fix certain manufacturing effects. For example, during the process of soldering memory components to printed circuit boards, data pre-stored may undergo data loss due to high temperature heating for solder (e.g., via infrared emitter) reflowing, however, such program refresh operation (e.g., using an incremental step pulse program (ISPP) operation) may take a time longer than the factory time constraint. In some memory devices, a qualification finish is required after manufacturing, and additional cost and resource are required to perform such finish, which includes cell revision and requalification.

Aspects of the present disclosure address the above and other deficiencies by implementing a new program refresh scheme using an all levels program (ALP) operation in combination with gate-induced drain leakage (GIDL) seed operation or wordline staggered discharge (WSD) program verify operation. Generally, a program refresh operation described herein can be performed to refresh data stored on cells addressable by (e.g., connected to) a programmed wordline to recover the RWB from an initial point in time.

For example, a local media controller (e.g., NAND controller) can initialize a loop of the program refresh operation with respect to a wordline selected from a set of wordlines of the memory array. Prior to initializing the loop of the program refresh operation, the local media controller can read out data from the memory device (e.g., NAND), send the data to a memory sub-system controller (e.g., SSD controller) to perform error correction using error correction code (ECC) to obtain error-corrected data, receive the error-corrected data from the memory sub-system controller, and initialize the loop of the program refresh operation after receiving the error-corrected data.

After initializing the loop of the program refresh operation, the local media controller can program a set of cells addressable by the wordline. To program the set of cells, the local media controller can perform all levels program operation, which includes a first phase and a second phase. In the first phase, an increasing or ramping wordline voltage (e.g., a voltage applied to one or more wordlines that is periodically ramped or increased by a step voltage amount) is applied to a set of wordlines of the memory array (e.g., the selected wordline and one or more unselected wordlines). In an embodiment, during the first phase, respective pillars (e.g., vertical conductive traces) corresponding to programming levels (e.g., L1 to L7 for a TLC memory device) are floated (e.g., disconnected from both a voltage supply and a ground). In an embodiment, a set of pillars corresponding to different programming levels are floated in sequence during the first phase (e.g., a first pillar corresponding to L1 is floated at a first time, a second pillar corresponding to L2 is floated at a second time, and so on). In an embodiment, a pillar can be floated by turning both a select gate drain (SGD) and select gate source (SGS) off (e.g., a selected SGD is toggled from a high voltage level ($V_{sgd\_high}$) to approximately 0V to prevent a corresponding bitline from discharging to the corresponding pillar). In an embodiment, a bitline corresponding to the first pillar associated with the programming level L1 is toggled from approximately 0V to a high voltage level ($V_{bl\_high}$) to ensure the pillar remains floating during the remainder of the first phase (e.g., application of the ramping wordline voltage). In an embodiment, once a pillar is floated, a voltage of each pillar can be boosted or increased in accordance with a step or increase of the ramping wordline voltage. At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains 0V during the first phase). In the second phase, a programming pulse is applied to the selected wordline to program all of the programming levels (e.g., L1 to L7 for a TLC memory device).

In some implementations, the local media controller can perform an all levels program operation integrated with a GIDL seed operation. Generally, the seed operation involves passing negative charge carriers (e.g., electrons) generated during the program refresh operation through at least one seeding path defined by at least one string of cells of a memory array, where each string of cells includes a respective cell of the set of cells that is addressable by a given bitline and source line. For example, the negative charge carriers can be generated during the program verify operation. The negative charge carriers are passed through the string to reach the cell addressable by the selected wordline in an attempt to make the potential of the channel (e.g., pillar) approximately equal to the first bias voltage. To perform the seed operation, the local media controller can cause a first bias voltage to be applied to the at least one string of cells (via its respective bitline or source line), and a second bias voltage to be applied to other wordlines that exist in the region between the selected wordline and the bitline (or source line). The seed operation can be performed using a seeding mask pattern, which can be a random mask pattern. If non-erased data (e.g., user) is stored in one or more of the cells of a string addressable by the other wordlines, the non-erased data can block the seeding path defined by the string. For example, if the seeding mask pattern is a random mask pattern, then at least one seeding path through at least one string of cells may be blocked. A blocked seeding path could result in a collection of the negative charge carriers within the channel. The collection of these negative charge carriers can result in a negative channel voltage that can cause program disturb. To address the collection of negative charges that can result from a blocked seeding path, the local media controller can cause GIDL with respect to the string of cells defining the blocked seeding path. GIDL refers to tunneling-based leakage currents from the drain of a field-effect transistor (FET) due to the (partial) overlap region that exists between the drain and the gate of the FET. The GIDL achieved during the seed operation can generate a corresponding number of positive charge carriers (e.g., holes) that are supplied into the channel to neutralize the negative charge carriers collected within the blocked seeding path. Accordingly, embodiments described herein can exploit GIDL, which is typically an undesirable phenomenon, to achieve improvements of the memory device.

GIDL can be realized from at least one of the drain-side of the memory array or the source-side of the memory array. To cause GIDL on the drain-side for a string of cells, the local media controller can cause respective bias voltages to be applied to the bitline and a drain-side select gate (SGD) connected to the string of cells. The magnitude of the difference between the bias voltages applied to the bitline and the SGD controls the amount of GIDL that is realized from the drain-side, which controls the number of positive charge carriers that are supplied into the channel from the drain-side to neutralize the negative charge carriers. To cause GIDL on the source-side for a string of cells, the local media controller can cause respective voltage biases to be applied to the source line and a source-side select gate (SGS) connected to the string of cells. The magnitude of the difference between the bias voltages applied to the source line and the SGS controls the amount of GIDL that is realized from the source-side, which controls the number of positive charge carriers that are supplied into the channel from the source-side to neutralize the negative charge carriers.

In some embodiments, a non-negative bias voltage can be applied to the bitline and/or the source line, and a non-positive bias voltage can be applied to the SGD and/or the SGS. For example, the bias voltage applied to the bitline can range between about 0 volts (V) to about 5 V, the bias voltage applied to the SGD can range between about –5 V to about 0 V. At least a portion of the cells within the string connected to respective wordlines can be grounded (e.g., at about 0 V) to allow for the movement of the positive charge carriers generated by the GIDL through the string. In some embodiments, all of the cells within the string connected to respective wordlines are grounded to allow for the movement of positive charge carriers from both the drain-side and the source-side. As described above, the difference between the bias voltages applied to the bitline and SGD and source line and SGS control the number of positive charge carriers that are supplied from drain-side and the source-side, respectively. Biasing the bitline and/or source line to high voltages (e.g., greater than or equal to 5 V) to cause drain-side GIDL and/or source-side GIDL can result in disturb effects. Examples of disturb effects include erase disturb and/or program disturb. For example, the high positive bias voltage applied to the bitline and/or the source line can cause erase disturb from stress due to the grounding of the cells. As another example, a large potential difference between the high positive bias voltage applied to the bitline and/or the source line and the negative voltage of the channel (e.g., pillar) can lead to program disturb caused by hot electron injection. At least the above-noted disturb effects can be mitigated by minimizing the magnitude of the non-negative bias voltage applied to the bitline and/or the source line, while maximizing the magnitude of the negative bias voltage applied to the SGD and/or the SGS. For example, a 3.5 V bias voltage applied to the bitline and a –4 V bias voltage applied to the SGD can generate a similar amount of drain-side GIDL as a 5 V bias voltage applied to the bitline and a –2.5 V bias voltage applied to the SGD, while reducing disturb effects. It may be even more beneficial to ground the bitline and/or the source line (e.g., 0 V) and apply an even higher magnitude negative bias voltage to the SGD and/or the SGS. In some embodiments, GIDL can be realized from a single side of the memory array (e.g., drain-side or source-side), depending on the location of the WL selected for the program refresh operation, in a manner that reduces disturb effects (e.g., erase disturb and/or program disturb).

In some implementations, the local media controller can perform all levels program operation integrated with WSD program verify operation. The local media controller can then initiate a program verify operation with respect to the set of cells. The program verify operation includes a staggered discharge operation. To perform the staggered discharge operation, the local media controller can adjust or vary the delay for discharge operations across wordlines (WLs). The staggered discharge operation may be performed by increasing the delay for WLs farther away from a selected WL. For example, when the program verify operation ends a pulse at a selected WL at a reference time, the local media controller can discharge the selected WL at the reference time and delay the discharge timings of other related/adjacent WLs. The local media controller may perform the staggered discharge operation on one or both side of the selected WL. In some embodiments, the local media controller can perform one or two-sided staggered discharge operations according to a position of the selected WL.

After performing the program verify operation, the local media controller can determine whether the additional loop of the program refresh operation is required. The local media controller can determine whether to perform an additional loop of the program refresh operation by determining whether the set of cells passes the program verify operation. More specifically, during the program verify operation, the local media controller can cause a target bias voltage to be applied to the wordline for sensing the set of cells. From the sensing, the local media controller can determine whether each cell of the set of cells has a higher $V_T$ than the target bias voltage. If so, then each cell of the set of cells has reached the target bias voltage and the additional loop is not needed (i.e., the current loop is the final loop). Thus, the program refresh operation will conclude for the wordline. Otherwise, if the least one cell of the set of cells does not have a higher $V_T$ than the target bias voltage, the program refresh loop can further start a second loop.

The program refresh scheme using all levels program (ALP) operation in combination with gate-induced drain leakage (GIDL) seed operation or wordline staggered discharge (WSD) program verify operation can be used to touch up after infrared (IR) reflow and pass the auto retention and cross-temperature reliability requirement or can be used to refresh the data after media scan to extend retention and reduce write amplification. This new program refresh scheme can be used in various logical wordline sequence writing, including source to drain or drain to source. This new program refresh scheme can be used with various cell types, including MLC, TLC, QLC, PLC, etc. This new program refresh scheme may be used for other types of vertical non-volatile memory device, including resistive random-access memory (ReRAM), phase-change random-access memory (PCRAM), etc.

Advantages of the present disclosure include, but are not limited to, improved memory device performance (e.g., improved Tprog) and reliability (e.g., recovered RWB, reduced ECC). For example, the program refresh scheme can increase read margin for storing more bits within a cell of a memory device (or increase read margin for storing the same number of bits within a cell of a memory device) and also can reduce the ECC. In addition, all levels program operation results in a reduction of programming time (Tprog). In particular, the programming time is reduced by performing fewer program pulses, as compared to other programming algorithms such as ISPP. In an embodiment, the total programming time associated with the all levels program operation includes a time corresponding to performing the wordline ramping (e.g., performing seven wordline ramps), a set of program pulses to program each programming level together (e.g., six pulses) and a set of program verify operations (e.g., forty-two program verify operations, wherein a program verify operation is performed for each level (e.g., seven levels) for each pulse (e.g., six pulses). This results in a significant reduction in Tprog, less energy per bit, and a wordline peak current reduction. Also, in an embodiment, the program verify operations are performed for each program pulse and each programming level, therefore no program verify skipping is needed, which simplifies the control of the memory sub-system and achieves verified target programming levels. Accordingly, the overall quality of service level provided by the memory sub-system is improved.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can include a program refresh (PR) component 137 that implements program refresh with all levels programming of a memory device in a memory sub-system. In one embodiment, rather than sequentially programming the multiple programming levels (e.g., levels L1 to L7 of a TLC memory cell), each program pulse programs all of the levels together. In an embodiment, all levels program operation is executed to enable each program pulse to program all of the levels of a selected wordline for a program refresh operation. All levels program operation may be integrated with gate-induced drain leakage (GIDL) seed operation or with wordline staggered discharge (WSD) program verify operation.

In some implementations of all levels program operation integrated with gate-induced drain leakage (GIDL) seed operation or wordline staggered discharge (WSD) program verify operation in the memory device 130, program refresh (PR) component 137 can be implemented using hardware or as firmware, stored on memory device 130, executed by the control logic (e.g., local media controller 135) to perform the operations related to performing program refresh as described herein. In some embodiments, the memory sub-system controller 115 includes at least a portion of PR component 137. For example, the memory sub-system controller 115 can include a processor 117 (e.g., a processing device) configured to execute instructions stored in local memory 119 for performing the operations described herein. The PR component 137 can be included within a memory die ("die") of a multi-die memory device. For example, memory device 130 can represent one memory die and can include PR component 137 as illustrated. Similarly, memory sub-system 110 can include multiple other memory devices (i.e., separate memory dies), which can each include a respective PR component. Further details regarding implementing program refresh with all levels program operation will be described in further detail below with reference to FIGS. 2-13.

Figure 1B:
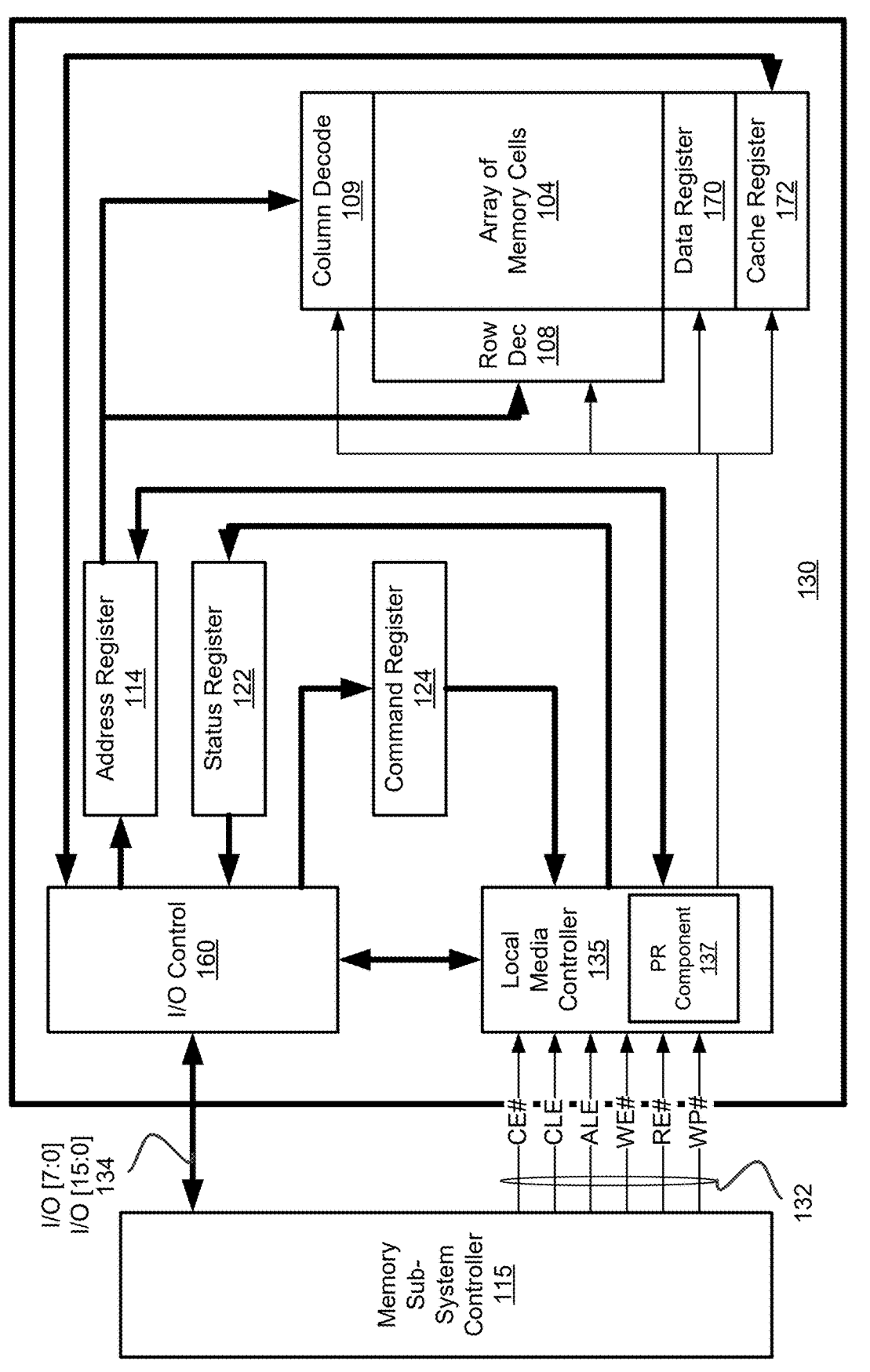
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
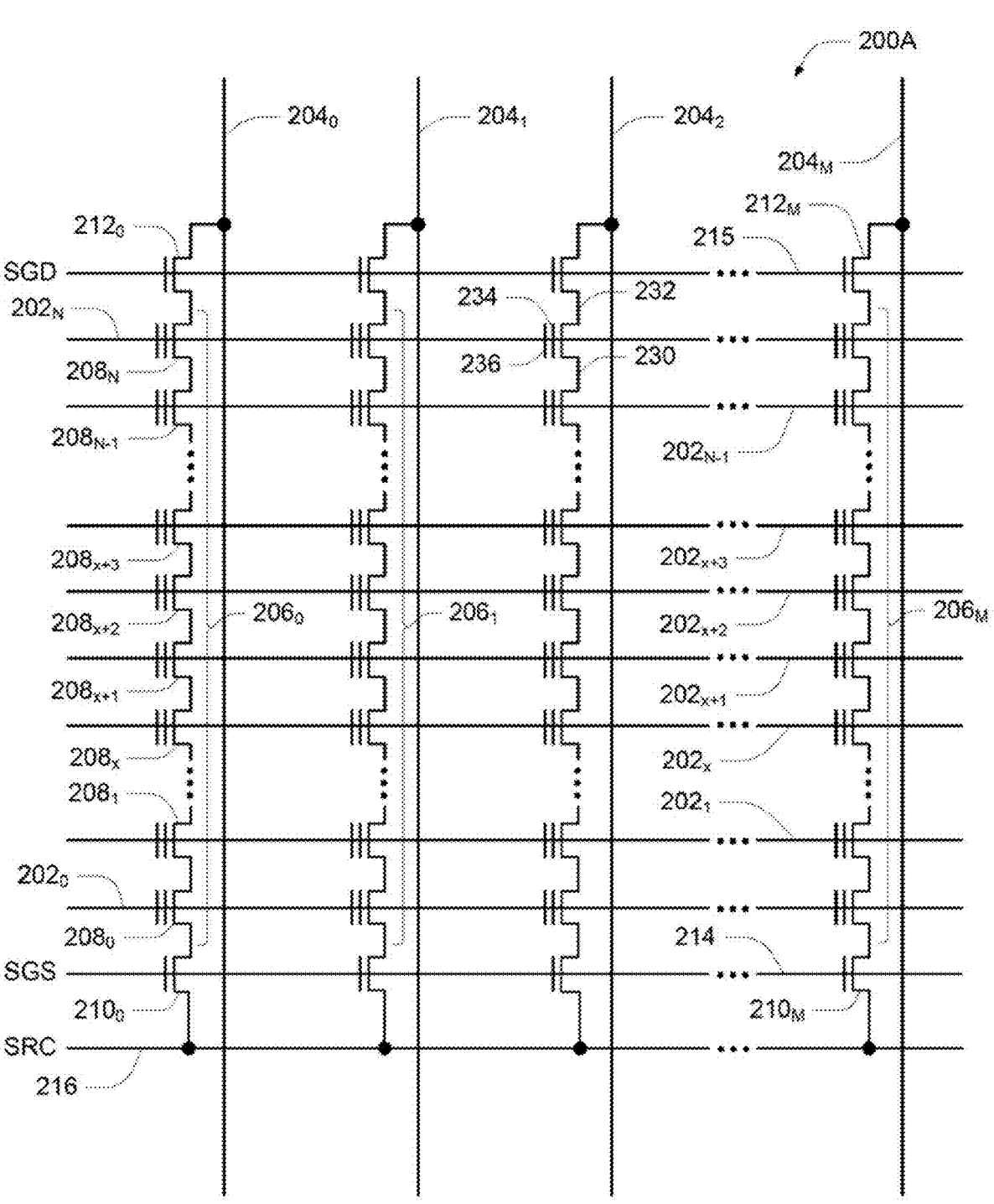
FIG. 2A-2B are schematics of portions of an array of memory cells as could be used in a memory of the type described with reference to FIG. 1B, in accordance with one or more embodiments of the present disclosure.
Figure 2B:
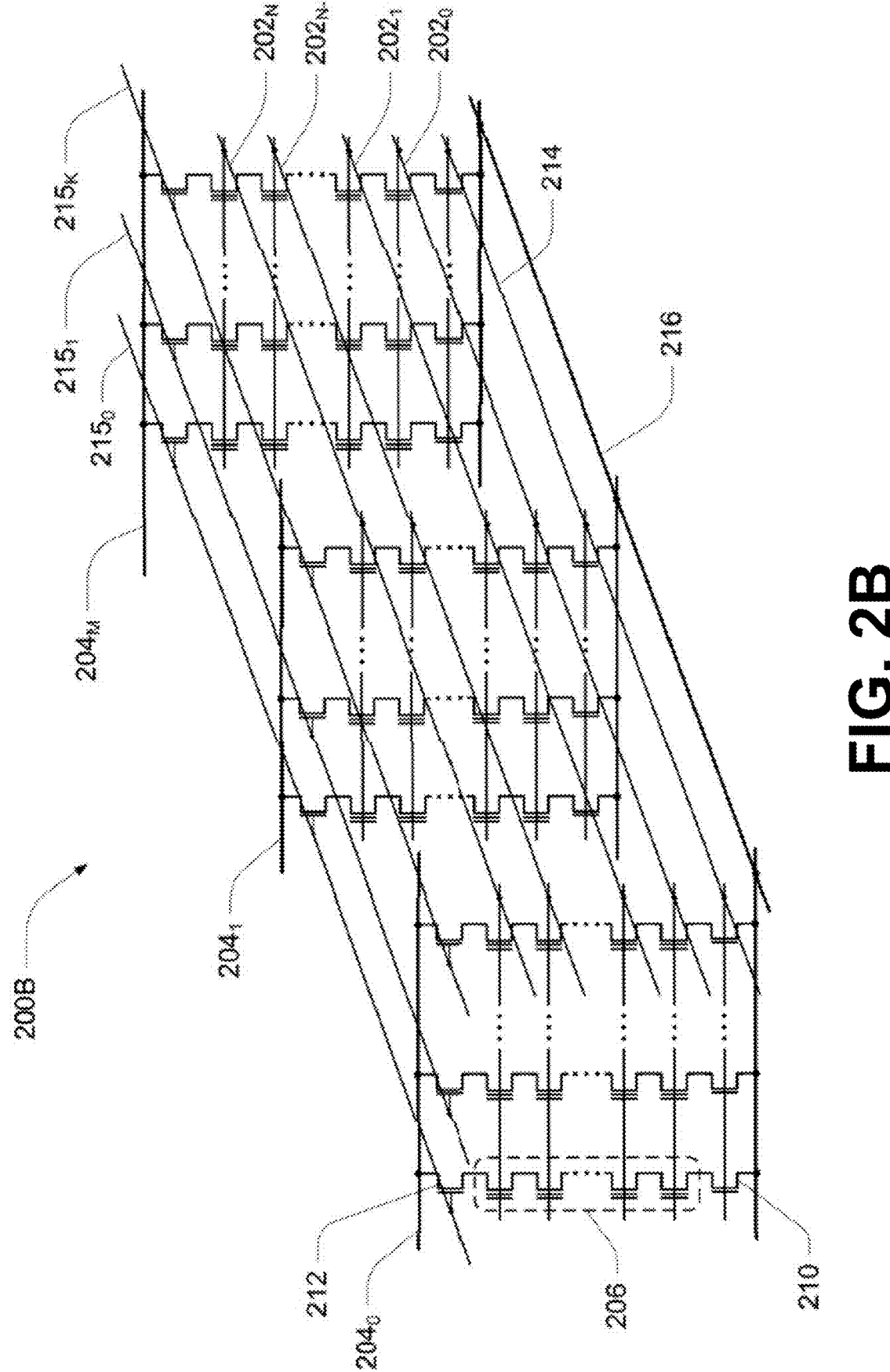

FIGS. 2A-2B are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines 2020 to 202N, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline 202N and selectively connected to even bitlines 204 (e.g., bitlines 2040, 2042, 2044, etc.) may be one physical page of memory cells 208 (e.g., even memory cells) while memory cells 208 commonly connected to wordline 202N and selectively connected to odd bitlines 204 (e.g., bitlines 2041, 2043, 2045, etc.) may be another physical page of memory cells 208 (e.g., odd memory cells). Although bitlines 2043-2045 are not explicitly depicted in FIG. 2A, it is apparent from the figure that the bitlines 204 of the array of memory cells 200A may be numbered consecutively from bitline 2040 to bitline 204M. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines 2020-202N (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings 2060 to 206M. Each string 206 can be connected (e.g., selectively connected) to a source line 216 (SRC) and can include memory cells 2080 to 208N. The memory cells 208 of each string 206 can be connected in series between a select gate 210, such as one of the select gates 2100 to 210M, and a select gate 212, such as one of the select gates 2120 to 212M. In some embodiments, the select gates 2100 to 210M are source-side select gates (SGS) and the select gates 2120 to 212M are drain-side select gates. Select gates 2100 to 210M can be connected to a select line 214 (e.g., source-side select line) and select gates 2120 to 212M can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell 2080 of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell 208N of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line 2040-204M by a select gate 212 and to the SRC 216 by a select gate 210. Multiple strings 206 can be selectively connected to the same bitline 204. Subsets of strings 206 can be connected to their respective bitlines 204 by biasing the select lines 2150-215L to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

Figure 3A:
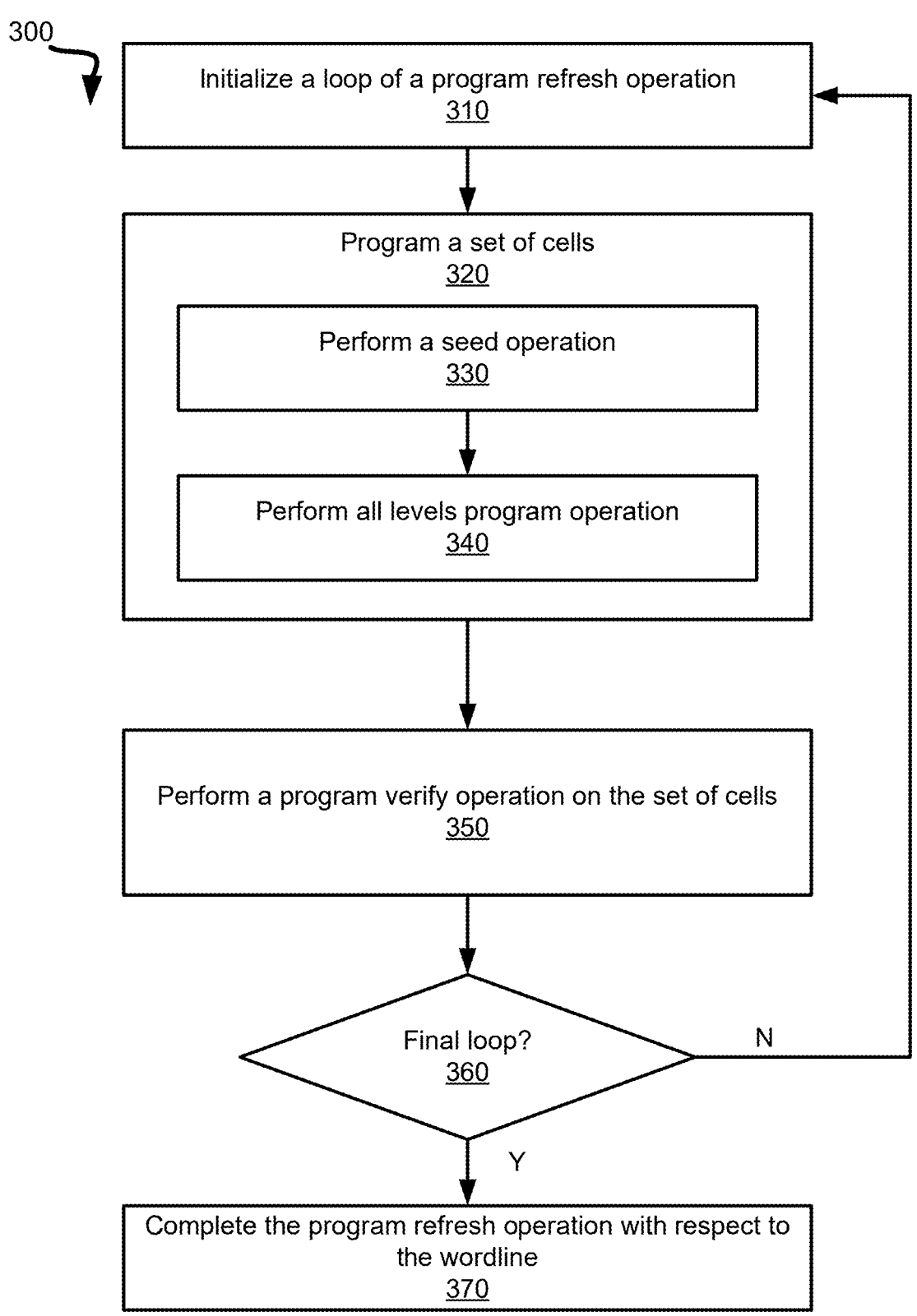

FIGS. 3A and 3B are flow diagrams of example methods of implementing program refresh with all levels program operation of a memory device in a memory sub-system in accordance with one or more embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the local media controller 135 and/or PR component 137 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device may initialize a loop of a program refresh operation. For example, the processing device may cause the loop of the program refresh operation to be initialized with respect to a wordline of a memory array. In some implementations, to initializing the loop, the local media controller can determine, e.g., by selecting, the wordline ("selected wordline") to perform the program refresh operation. The loop of the program refresh operation can be initialized in response to receiving a request to perform the program refresh operation (e.g., via the memory sub-system controller 115). The request can include a selection of the wordline for performing the program refresh operation. In some embodiments, the loop of the program refresh operation is initialized after receiving error-corrected data from the memory sub-system controller.

In some implementations, prior to initializing the loop of the program refresh operation, the processing device can read out data from the memory device (e.g., NAND), send the data to a memory sub-system controller (e.g., SSD controller) to perform error correction using error correction code (ECC) to obtain error-corrected data, receive the error-corrected data from the memory sub-system controller, and initialize the loop of the program refresh operation after receiving the error-corrected data.

At operation 320, the processing device may program a set of cells. For example, the processing device may cause the set of cells, addressable by the selected wordline, to be programmed (e.g., reprogrammed) according to all levels program operation. Performing all levels program operation may include performing a seed operation 330 and a program pulse operation 340.

At operation 330, the processing device may perform a seed operation on the set of cells. In some implementations, the processing device may perform a GIDL seed operation on the set of cells at operation 330. The detail regarding the GIDL seed operation is illustrated with respect to FIGS. 7-10.

Figure 4:
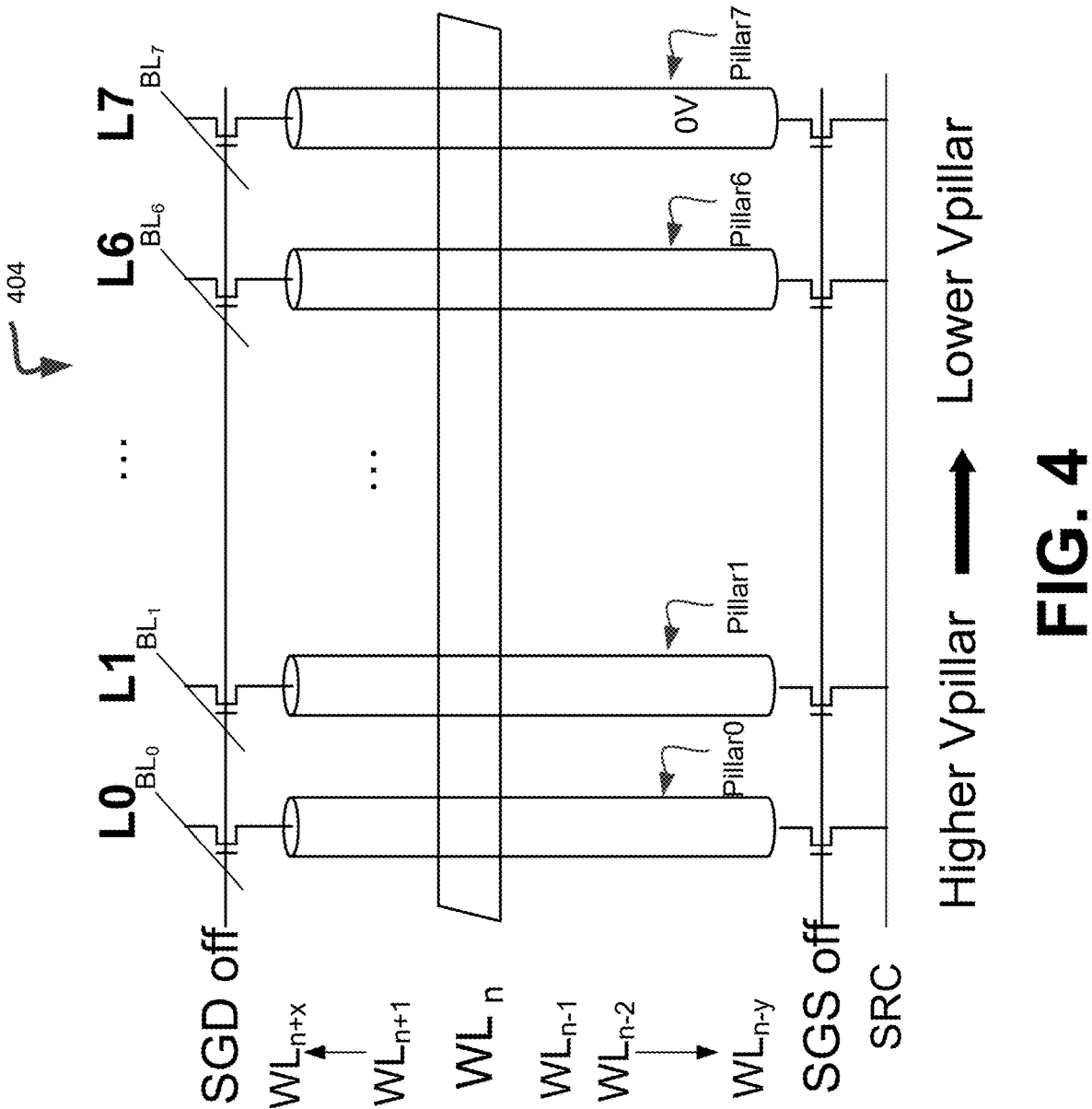
FIG. 4 illustrates an example programming operation including multiple pulses used for all levels programming of a memory device in a memory sub-system in accordance with one or more embodiments of the present disclosure.
Figure 5:
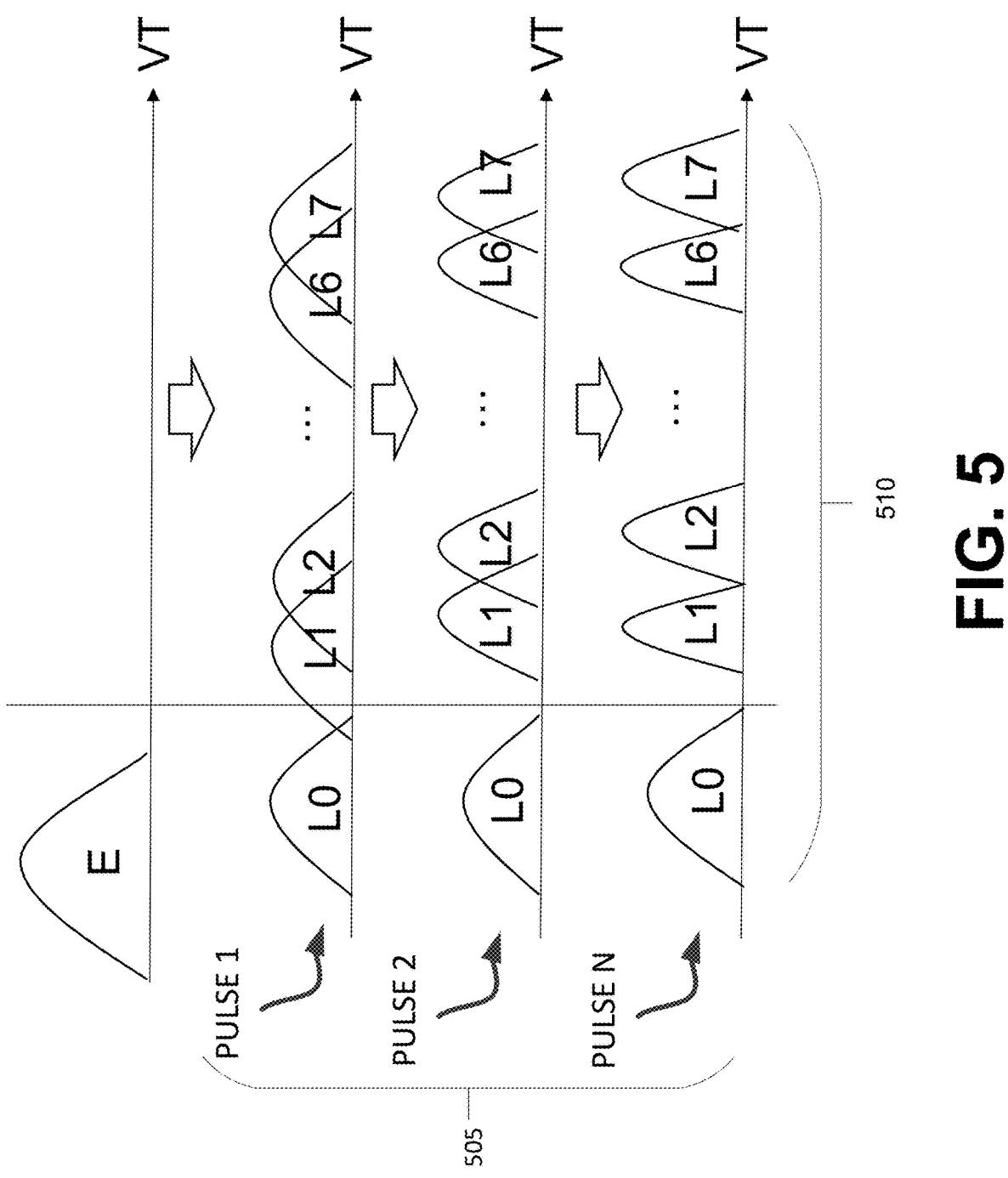
FIG. 5 illustrates an example memory array including wordlines and bitlines corresponding to multiple programming levels to be programmed according to an all levels program operation in accordance with one or more embodiments of the present disclosure.
Figure 6:
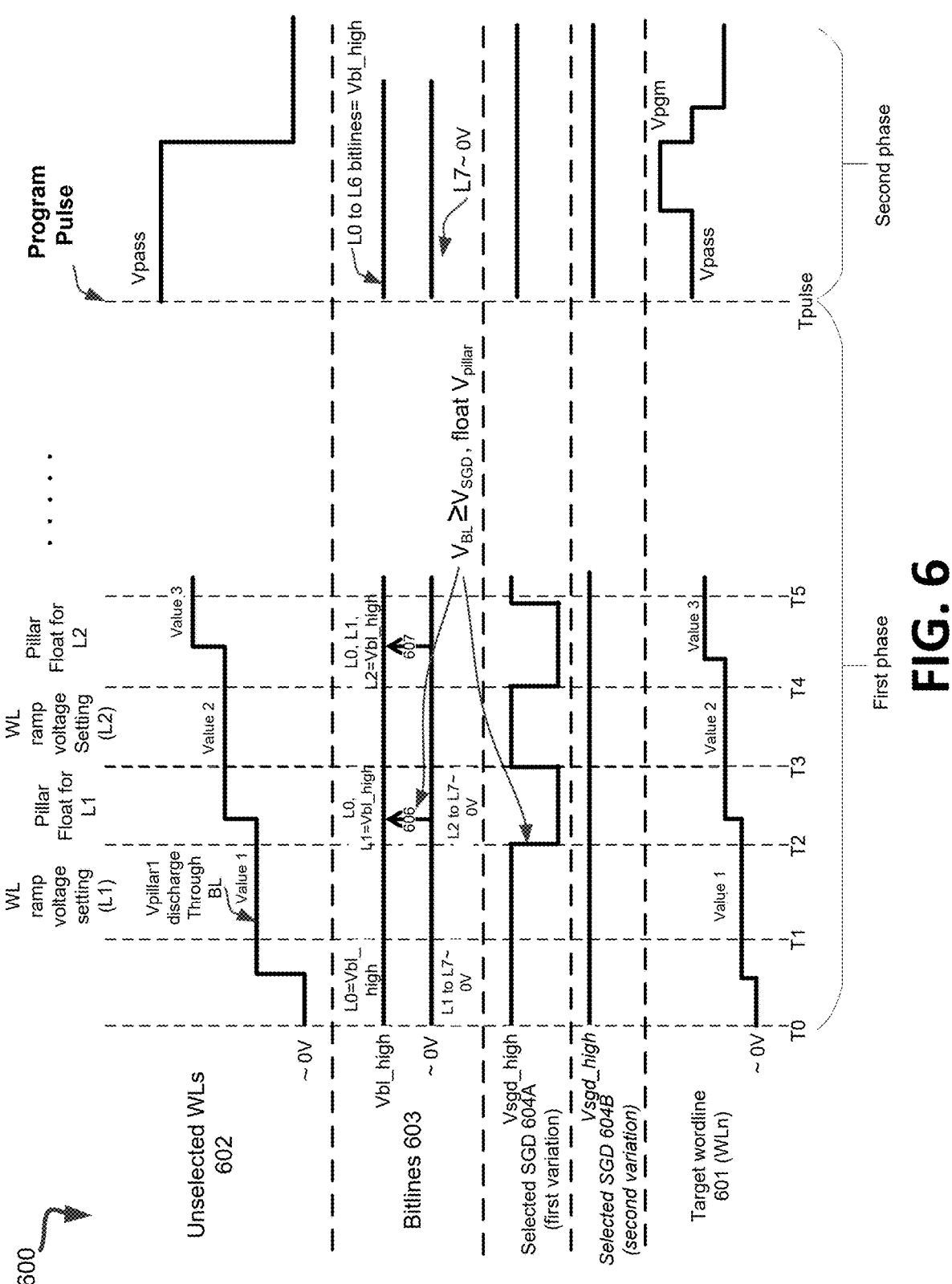
FIG. 6 illustrates example program pulse waveforms corresponding to all levels programming of a memory device in a memory sub-system in accordance with one or more embodiments of the present disclosure.

At operation 340, the processing device may perform all levels program operation on the set of cells. FIG. 3B illustrates an example detail of operation 340, and FIGS. 4-6 illustrates all levels program operation. For example, referring to FIG. 3B, at operation 343, the processing device may cause a ramping wordline voltage to be applied to one or more wordlines of the memory array (e.g., ramping wordline voltage applied to target wordline 601, as described in greater detail below with reference to FIG. 6). In an embodiment, all levels program operation includes a first phase. In the first phase, an increasing or ramping wordline voltage (e.g., a voltage applied to one or more wordlines that is periodically ramped or increased by a wordline step voltage) is applied to a set of wordlines of the memory array (e.g., a selected wordline corresponding to the set of identified memory cells to be programmed and one or more unselected wordlines). For example, upon identifying a set of memory cells to be programmed (e.g., the memory cells associated with one or more wordlines of a memory array identified in operation 320), the processing device can initiate a first phase of all levels program operation during which a ramping wordline voltage is applied to a set of wordlines including a target wordline associated with the set of memory cells to be programmed.

At operation 345, the processing device may establish a set of voltage levels. In an embodiment, as the ramping wordline voltage is applied to the set of wordlines (in operation 343), the set of pillars are floated in sequence. In an embodiment, the pillars refer to the channel regions (e.g., composed of polysilicon) of the access transistors of a vertical string of memory cells. In an embodiment, by floating each pillar associated with a respective programming level at different times in operation 345, each pillar is exposed to a different length of the wordline voltage ramp process while in the floating state. In an embodiment, as a result each pillar is boosted to a different voltage as a function of the different exposure times associated with the ramping wordline voltage. For example, a first pillar that is floated first in sequence is exposed to a longest relative length of time of the wordline voltage and, as such, is boosted to a highest voltage level, a second pillar that is floated second in sequence is exposed to a next longest relative length of time of the wordline voltage and, as such, is boosted to a next highest voltage level, and so on.

For example, in operation 345, the processing device may cause a disconnection of a set of pillars associated with the set of memory cells from a voltage supply and ground voltage (i.e., ground), wherein each pillar corresponds to a programming level of a set of programming levels (e.g., L1 to L7 for a TLC memory device). In an embodiment, during the first phase of all levels program operation, respective pillars (e.g., vertical conductive traces of the memory array) corresponding to programming levels (e.g., L1 to L6 for a TLC memory device) are floated (e.g., disconnected from both a voltage supply and a ground). In an embodiment, the set of pillars corresponding to different programming levels are floated in sequence during the first phase (e.g., a first pillar corresponding to L1 is floated at a first time, a second pillar corresponding to L2 is floated at a second time, and so on).

In an embodiment, the pillars are floated by turning a corresponding source-side select transistor (SGD) and a corresponding drain-side select transistor (SGS) off. In an embodiment, a pillar can be floated by turning both a select gate source (SGS) off and select gate drain (SGD) off (e.g., a selected SGD is toggled from a high voltage level (e.g., $V_{sgd\_high}$) to approximately 0V to prevent a corresponding bitline from discharging to the corresponding pillar). In an embodiment, a bitline corresponding to the first pillar associated with the programming level L1 is toggled from approximately 0V to a high voltage level (e.g., $V_{BL\_high}$) to ensure the pillar remains floating during the remainder of the first phase (e.g., application of the ramping wordline voltage).

In an embodiment, once floated, a voltage of each pillar (Vpillar) can be periodically boosted or increased in accordance with each step or increase of the ramping wordline voltage (e.g., each step of the ramping wordline voltage increases or boosts the pillar voltage for a pillar that is floating). At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase). Additional details of operations 343 and 345 are provided below with reference to FIG. 6.

FIG. 4 illustrates an example set of pillars in a memory array 404 that are placed in a floating state in accordance with operations 320 and 330 of FIG. 3. As shown in FIG. 4, the example memory array 404 of a TLC memory device includes wordlines (e.g., a target wordline (WLn), a first set of unselected wordlines (e.g., WLn−1 and WLn+1 to WLn+x), a second set of unselected wordlines (e.g., WLn−2 to WLn−y) and a set of bitlines (e.g., $BL_0$ to $BL_7$) corresponding to an erase level (L0) and multiple programming levels (L1, . . . L7) to be programmed according to an all levels program operation in accordance with one or more embodiments of the present disclosure. As shown in FIG. 4, the memory array 404 may be arranged in rows (each corresponding to a wordline) and columns (each corresponding to a bitline), wherein the intersection of a wordline and bitline constitutes the address of the memory cell. Each column may include a string of series-connected memory cells connected (e.g., selectively connected) to a common source (SRC). The common source can be coupled to a reference voltage (e.g., ground voltage or simply "ground" (Gnd) or a voltage source (e.g., a charge pump circuit or power supply which may be selectively configured to a particular voltage suitable for optimizing a programming operation, for example). A string of memory cells may be connected in series between a first select transistor (e.g., a source-side select transistor) referred to as a source select gate (SGS) and a second select transistor (e.g., a drain-side select transistor) referred to as a drain select gate (SGD). The source select transistors may be commonly connected to a first select line (e.g., a source select line) and the drain select transistors may be commonly connected to a second select line (e.g., a drain select line).

As shown in FIG. 4, the memory array 404 includes a set of pillars (e.g., Pillar0, Pillar1 . . . Pillar7) corresponding to substantially vertical strings of series coupled memory cells of the memory array 404. In an embodiment, the pillars refer to the channel regions (e.g., composed of polysilicon) of the access transistors of a vertical string of memory cells. In an embodiment, the channel region is first discharged to ground before being floated and boosted to a particular voltage. As shown in FIG. 4, each of the pillars are floated and a corresponding voltage is boosted at different voltage levels (Vpillar) at different times (e.g., during operation 345 of FIG. 3) by turning the source-side select transistor (SGS) and the drain-side select transistor (SGD) off. In an embodiment, once a respective pillar is floated, a voltage of each pillar (Vpillar) can be boosted or increased in accordance with a step or increase of the ramping wordline voltage. At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase).

In an embodiment, as the ramping wordline voltage is applied, each of the pillars of a set of pillars (e.g., Pillar1 to Pillar6 in FIG. 4) are floated in sequence. In an embodiment, a voltage of the pillar corresponding to the erase state (Pillar0) is floated prior to the application of the ramping wordline voltage. For example, Pillar 1 is floated at a first time during application of the ramping wordline voltage, Pillar 2 is floated at a second time during application of the ramping wordline voltage, and so on.

In an embodiment, while a respective pillar is in the floated state, a voltage corresponding to that pillar is boosted by the ramping wordline voltage. For example, Pillar 1 is floated at a first time and is boosted to a pillar voltage level corresponding to each increase of the ramping wordline voltage (e.g., each time the ramping wordline voltage is stepped). In this example, since Pillar 1 is floated at a first time, the corresponding pillar voltage (e.g., Vpillar1) is boosted multiple times in accordance with each increase of the ramping wordline voltage until the end of the wordline ramping phase (e.g., the first phase) of all levels program operation, as shown and described in greater detail with respect to FIG. 6.

In an embodiment, as shown in FIG. 4, since the pillars are floated in sequence (e.g., Pillar1 is floated before Pillar2, Pillar2 is floated before Pillar3, and so on), the respective pillar voltages are boosted from higher levels to lower levels moving from left to right in FIG. 4. In this regard, Vpillar1 is higher than Vpillar2, Vpillar2 is higher than Vpillar3, and so on as a function of the time when each pillar is floated. In an embodiment, the Vpillar for a floated pillar is boosted to a higher voltage level each time the ramping wordline voltage increases. As such, pillars that are floated earlier are boosted by a greater number of wordline ramping increases.

FIG. 4 illustrates the selected wordline (WLn) to which the set of program pulses are applied. In an embodiment, a first set of unselected wordlines including WLn−1 and WLn+1 through WLn+x, as shown in FIG. 4, are ramped to a pass voltage (Vpass) for programming levels L1 to L7 (e.g., WLn+1 and above are ramped in seven levels to Vpass for fine tuning the corresponding pillar potential). In an embodiment, the pillar potential may stay on approximately 0V through a conduction with corresponding bitline for L7 program or be inhibited on any of the seven voltages (e.g., between 0V and Vpass) for L0~L6 program, depending on user data levels. In an embodiment, a second set of unselected wordlines including WLn−2 through WLn−y are set to 0V (e.g., SGS~0V, SGD~0V).

Referring back to FIG. 3B, at operation 347, the processing device may apply a program pulse. In an embodiment, all levels program operation includes a second phase. In the second phase, the processing device can cause a program pulse to be applied to the set of memory cells (e.g., the set of memory cells of memory array of FIG. 2 or memory array 404 of FIG. 4), wherein the program pulse programs all programming levels associated with the identified set of memory cells. In an embodiment, the program pulse can be applied to the one or more target wordlines associated with the set of memory cells to be programmed (e.g., the set of memory cells identified in operation 320), wherein the program pulse programs each of the programming levels together (e.g., programming levels L1 to L7 are programmed using the program pulses). In an embodiment, the boosting of the pillar voltages during a first phase enables the programming of all of the programming levels together using each program pulse, the memory cells of the respective programming levels can be raised to the corresponding target voltage level in quicker and more efficient manner.

In an embodiment, operations 343-347 can be iteratively executed (e.g., phase 1 and phase 2 shown in FIG. 6 are iteratively performed), wherein each execution of operation 347 includes the application of a single program pulse until each of the programming levels reach the corresponding target voltage level. For example, operations 343-347 can be iteratively performed to enable the execution of pulse 1, pulse 2 . . . pulse N of FIG. 5 until all of the programming levels (e.g., L1 to L7) have been programmed. For each pulse of the set of pulses, a program verify operation can be performed for each programming level to verify that target voltage corresponding to each respective programming level has been reached. In an embodiment, the processing device completes the execution of method 300 in response to verifying (using program verify operations) that all of the programming levels have been programmed (e.g., following the application of set of pulses in accordance with the iterative performance of operations 343-347). In an example, all levels program operation can include a set of pulses (e.g., six pulses, or less than six pulses depending on reliability trade-off) to program seven programming levels, results in the application of forty-two program verify operations.

FIG. 5 illustrates an example programming operation including a set of multiple pulses 505 (e.g., pulse 1, pulse 2 . . . pulse N) applied to program all programming levels (e.g., L1, L2, . . . L7) of the identified set of memory cells of the memory array, according to embodiments of the present disclosure. As shown in FIG. 5, each respective pulse (e.g., Pulse 1, Pulse 2 . . . and Pulse N) is used to program each of programming levels (e.g., L1 to L7) of a memory device in a memory sub-system in accordance with one or more embodiments of the present disclosure. In an embodiment, each pulse programs an entire set of program levels 510 (e.g., all levels) of the memory cells together. In an embodiment, the set of pulses 505 are applied to a target wordline (e.g., $WL_n$) associated with the set of memory cells to be programmed, as shown and described with reference to FIG. 6.

FIG. 6 illustrates example voltage waveforms of various portions of a memory array during execution of all-level program operations (e.g., the operations of method 300 of FIG. 3). In an embodiment, the portions of the memory array include a set of memory cells associated with a target wordline 601 (WLn) and portions of corresponding voltage waveforms resulting from execution of an all levels program operation (such as the operations of method 300, described above), according to embodiments of the present disclosure. In an embodiment, the processing device identifies a set of memory cells to be programmed by an all levels program operation (e.g., target wordline 601 (WLn)) (e.g., operation 310 of method 300, described above) In an embodiment, the all levels program operation includes a first phase (starting from time T0) wherein a ramping wordline voltage is applied (e.g., operation 320) to a set of wordlines (e.g., target wordline 601 and a set of one or more unselected wordlines 602). For example, as shown in FIG. 6, a ramping wordline voltage is applied to wordline 601 where the voltage is incrementally ramped from 0V to 3V between T0 and T5. While the ramping wordline voltage is applied, a set of pillars corresponding to different programming levels are sequentially floated (e.g., by uncoupling the set of pillars in operation 330). In an embodiment, a second set of unselected wordlines (e.g., WLn−2 and below) are set to 0V (e.g., the voltage of the source select gate (VSGS) is 0V, and unsel_SGD=0V).

In an embodiment, prior to the first phase shown in FIG. 6 (e.g., prior to the application of the ramping wordline voltage), the pillar associated with the erase level (L0) is floated, a bitline 603 corresponding to L0 is set to $V_{BL\_high}$, and a selected SGD (Sel_SGD 604A, Sel_SGD 604B) is set to Vsgd_high. In an embodiment, the selected SGD can be toggled between Vsgd_high to a ground (e.g., approximately 0V), as shown with respect to a first waveform corresponding to Sel_SGD 604A. In accordance with another embodiment, the selected SGD can remain at Vsgd_high during the first phase, as shown with respect to a second waveform corresponding to Sel_SGD 604B. In an embodiment, the use of sel_SGD 604A (e.g., the toggling variation) is a first variation that can be implemented by the processing device.

In another embodiment, the use of Sel_SGD 604B (e.g., the variation wherein Sel_SGD 604B remains at Vsgd_high) is a second variation that can be implemented by the processing device.

As shown in FIG. 6, between time T0 and T1, a first ramp of the ramping wordline voltage (e.g., from approximately 0V to value 1, in accordance with the step voltage) is applied. During a time between T1 and T2, the ramping wordline voltage is applied to a first pillar (e.g., Pillar1 of FIG. 4) corresponding to programming level L1. In an embodiment, during this time period, the voltage of Pillar1 (Vpillar1) is discharged through the bitline 603 corresponding to L1 which is set to ground (e.g., approximately 0V).

In an embodiment, a selected SGD 604A and the voltage levels of the bitlines 603 can be used to float the pillars in sequence and boost the corresponding pillar voltages (e.g., Vpillar) when each respective pillar is in the floating state. As shown in FIG. 6, during a first time period (e.g., T0 to T2), a voltage level applied to a selected SGD 604A ($V_{SGD}$) is a high source voltage level (Vsgd_high). In an embodiment, as shown in FIG. 6, at time T2, the selected SGD 604A can be toggled from Vsgd_high to ground (e.g., approximately 0V) in order to float the first pillar (e.g., Pillar1 of FIG. 4) corresponding programming level L1. As shown in FIG. 6, at time t2, the toggling of the selected SGD 604A from Vsgd_high to ground (e.g., approximately 0V) disconnects Pillar and floats the voltage of Pillar1 (Vpillar1) corresponding to programming level L1. In an embodiment, in response to or following the toggling of VSGD (e.g., toggling the selected SGD 604A), the L1 bitline is caused to toggle from ground (e.g., 0V) to a high voltage (VBL high), as illustrated by the arrow 606. In an embodiment, the toggling of the L1 bitline to VBL high ensures Pillar1 is floated and Vpillar1 can be boosted in accordance with the wordline ramping level at the time of the floating. In an embodiment, Pillar1 is floated when the voltage of the bitline (VBL) is greater than or equal to VSGD).

In the example shown in FIG. 6, the Vpillar1 is boosted while Pillar1 is floated (e.g., in the floating state) and exposed to a longest relative duration of the application of the ramping wordline voltage to the target wordline, wherein the ramping wordline voltage is periodically increased or stepped by a wordline step voltage level. In this example, the Vpillar1 remains floating from T2 to the end of the first phase (e.g., in view of the setting of the corresponding bitline to VBL high) and is repeatedly boosted by the ramping wordline voltage each time the ramping wordline voltage is ramped or increased. At the end of phase 1, Vpillar1 is boosted by the wordline step voltage (or a preset boost ratio of the wordline step voltage). For example, the Vpillar1 is boosted to value 7 (e.g., approximately 7V) after completion of the first phase (e.g., Vpillar1=[total ramping wordline voltage (e.g., approximately 8V)]−[the wordline voltage level at the time Vpillar1 is floated (e.g., 1V)]).

In an embodiment, as shown in FIG. 6, following the toggling of the selected SGD 604A (at time T2), and the corresponding increase of the L1 bitline voltage level from approximately 0V to $V_{BL\_high}$ (as illustrated by arrow 606), the bitline voltage level (e.g., $V_{BL}$) is greater than the $V_{SGD}$, resulting in Pillar1 remaining in a floating state and subject to boosting by the ramping wordline voltage until the end of the first stage.

As shown in FIG. 6, the floating of respective pillars continues for each of the set of pillars (e.g., pillars corresponding to L1 to L6) to enable each Vpillar to be boosted in accordance with the ramping wordline voltage. For example, at time T3, the selected SGD 604A is toggled from approximately 0V to Vsgd_high to enable the setting of the ramping wordline voltage in accordance with a next step or increase. It is noted that the SGD 604A is shared between the various strings and pillars such that the toggling of the SGD 604A from low to high (e.g., at time T3) does not affect Vpillar1 (e.g., the Vpillar for the pillars floated prior to the toggling of SGD 604A from low to high are not affected). As shown in FIG. 6, during a time period between T3 and T4 when the selected SGD 604A is Vsgd_high and $V_{BL2}$ is approximately 0V, value 2 of the ramping wordline voltage is applied. At time T4, Pillar2 is floated by toggling the selected SGD 604A from Vsgd_high to ground (e.g., approximately 0V). In an embodiment, following the toggling of the selected SGD 604A to Vsgd_high, the L2 bitline toggles from ground (e.g., approximately 0V) to $V_{BL\_high}$, as illustrated by the arrow 607. In an embodiment, the toggling of the L2 bitline to the inhibit voltage level maintains the floating of Pillar2 for the remainder of the first phase.

Although the portion of the waveforms shown in FIG. 6 relate to the floating of Pillar1 and Pillar2, it is to be appreciated the operations described in method 300 of FIG. 3 can be repeated as part of all levels program operation to float the pillars to move or adjust the corresponding Vpillar levels for each of the remaining programming levels (e.g., L3 to L6 for a TLC memory device). In an embodiment, as shown in FIG. 6, Pillar7 corresponding to programming level L7 is not floated due to the corresponding Vpillar being approximately 0V, as shown in FIG. 4. For example, at the end of the first phase, Vpillar1 is boosted to a first value (e.g., 7V), wherein Vpillar1=[total ramping wordline voltage (e.g., Vpass)]−[the wordline voltage level at the time Pillar1 is floated (e.g., value 1)], Vpillar2 is boosted to a second value (e.g., 6V), wherein Vpillar2=[total ramping wordline voltage (e.g., Vpass)]−[the wordline voltage level at the time Vpillar2 is floated (e.g., value 2)], Vpillar3 is boosted to a third value (e.g., 5V), wherein Vpillar3=[total ramping wordline voltage (e.g., Vpass)]−[the wordline voltage level at the time Vpillar3 is floated (e.g., value 3)], and so on. Accordingly, the boosted Vpillar is established for each respective pillar during the first stage, as shown in operation 345 of FIG. 3B.

In an embodiment, at the end of the first phase (e.g., at Tpulse), the wordlines 601, 602 are ramped to a pass voltage level (Vpass). In an embodiment, the unselected wordlines are ramped in seven ramping levels to Vpass for fine tuning the Vpillar (e.g., pillar potential). At time Tn, different programming stress levels have been applied to corresponding programming level (Ln), as represented by the following expression: $V_{stresslevel(Ln)}$=Vpgm_WL−Vpillar, here Vpillar=(Vpass−Vwl_time_of_float) X boost_ratio; wherein Vwl_time_of_float is the voltage level of the ramping wordline voltage at the time the pillar (Pillar_n) corresponding to the programming level (Ln) is floated; and wherein the boost_ratio is a preset value (e.g., 1, 0.8, 0.6, etc.) corresponding to an amount of boost to the Vpillar as a function of the ramping wordline voltage.

In an embodiment, in accordance with the second variation noted above, the selected SGD 604B may be maintained at Vsgd_high. According to this variation, as shown in FIG. 6, the selected SGD 604B remains at Vsgd_high during the first phase of the programming operation (e.g., the selected SGD 604B is not toggled). According to this variation, with the selected SGD 604B remaining at Vsgd_high, the floating of each pillar is initiated by toggling the voltage (Vbl) of the bitline 603 corresponding to a respective pillar from approximately 0V to Vbl_high. For example, the L1 bitline can be toggled from ground (e.g., 0V) to a high voltage $(V_{BL\_high})$, as illustrated by the arrow 606, in order to float Pillar1. In an embodiment, the toggling of the L1 bitline to $V_{BL\_high}$ ensures Pillar1 is floated and Vpillar1 can be boosted in accordance with the wordline ramping level at the time of the floating, and repeatedly boosted each time the wordline ramping level increases.

As shown in FIG. 6, during the second phase of the programming operation, a first program pulse is applied at time Tpulse. In an embodiment, the first program pulse programs each of the programming levels (e.g., L1 to L7), in operation 340 of FIG. 3. In an embodiment, a programming voltage (Vpgm) of each pulse is applied to the selected wordline 601 to program each of the levels (L1 to L7 of a TLC memory device). In an embodiment, for the memory cells in a selected page, the same Vpgm_WL is applied on the second phase Vpgm. However, different Vpillars are setup during the first phase depending on the corresponding target data level. In an embodiment, the different $V_{stresslevels}$ are applied on the memory cells of L1 to L7. In an embodiment, a series of program pulses (e.g., as shown in FIG. 5 as applied to the target wordline 601) to complete the programming of the set of programming levels. In an embodiment, for each pulse of the set of pulses applied during operation 340 of FIG. 3A, a program verify operation can be performed for each programming level to verify that target voltage corresponding to each respective programming level has been reached.

In an embodiment, as shown in FIG. 3, operations 320 through 340 can be repeated following the performance of each program pulse and associated program verify operations until the programming of each programming level is completed.

Referring back to FIG. 3A, at operation 350, the processing device may perform a program verify operation on the set of cells. In some implementations, the processing device may perform a WSD program verify operation on the set of cells. The detail regarding the WSD program verify operation is illustrated with respect to FIGS. 11A-12.

At operation 360, the processing device may determine whether the additional loop of the program refresh operation is required. In some implementations, the processing device may determine whether to perform an additional loop of the program refresh operation by determining whether the set of cells passes the program verify operation. In some implementations, during the program verify operation, the processing device may cause a target bias voltage to be applied to the wordline for sensing the set of cells. From the sensing, the processing device may determine whether each cell of the set of cells has a higher $V_T$ than the target bias voltage. If so, then each cell of the set of cells has reached the target bias voltage and the additional loop is not needed (i.e., the current loop is the final loop). If the least one cell of the set of cells does not have a higher $V_T$ than the target bias voltage), then the additional loop is needed and the processing device may further perform a second loop of the program refresh operation through operations 310-350.

At operation 370, responsive to determining that the additional loop of the program refresh operation is not required, the processing device may complete the program refresh operation with respect to the wordline. In some implementations, since charge loss can be logarithmic, the program refresh operation described herein can be performed on a logarithmic time interval. For example, a first program refresh operation (e.g., a first set of loops) can be performed after 10 hours, a second program refresh operation (e.g., a second set of loops) can be performed after 100 hours, a third program refresh operation (e.g., a third set of loops) can be performed after 1,000 hours, etc.

In some implementations, operation 330 may be performed using a normal seed operation while operation 350 may be performed using the WSD program verify operation. In some implementations, operation 330 may be performed using the GIDL seed operation while operation 350 may be performed using the normal program verify operation. In some implementations, operation 330 may be performed using the GIDL seed operation while operation 350 may be performed using the WSD program verify operation.

FIG. 7 is a diagram illustrating an example of program refresh with all levels program operation integrated with gate-induced drain leakage (GIDL) seed operation implemented for a portion of an array of memory cells ("portion") 700, in accordance with some embodiments of the present disclosure. More specifically, the portion 700 can correspond to cells addressable by (e.g., connected to) a particular bitline (not shown) of the array.

As shown, the portion 700 includes a string of cells addressable by respective wordlines (WLs). The WLs include WLn−3 710-1 through WLn+3 710-7. For example, cell 712 is addressable by WLn 710-4. In this example, WL, 710-4 is a wordline selected for program refresh. The portion 700 further includes a drain-side select gate (SGD) 720 and a source-side select gate (SGS) 730. Although not shown in FIG. 7, the portion 700 further includes a common source line connected to SGS 730, similar to SRC 216 described above with reference to FIG. 2A.

In this illustrative example, GIDL is being caused on the drain-side and/or the source-side. For example, to cause GIDL on the drain-side, the bitline can be biased to a voltage "$V_1$" and SGD 720 can be biased to a voltage "$V_2$". The difference between $V_1$ and $V_2$ defines the amount of GIDL from the drain-side and thus the amount of positive charge carriers (e.g., holes) that are generated on the drain-side. In some embodiments, $V_1$ is a non-negative voltage and $V_2$ is a non-positive voltage. For example, $V_1$ can range from about 0 V to about 5 V, and $V_2$ can range from about −5 V to about 0 V. In an embodiment, $V_1$ can be about 5 V and $V_2$ can be about −2.5 V.

As another example, to cause GIDL on the source-side, the source line can be biased to a voltage "$V_3$" and SGS 730 can be biased to a voltage "$V_4$". The difference between $V_3$ and $V_4$ defines the amount of GIDL from the source-side and thus the amount of positive charge carriers that are generated on the source-side. In some embodiments, $V_3$ is a non-negative voltage and $V_4$ is a non-positive voltage. For example, $V_3$ can range from about 0 V to about 5 V, and $V_4$ can range from about −5 V to about 0 V. In an embodiment, $V_3$ can be about 5 V and $V_2$ can be about −2.5 V.

Moreover, it is assumed that all of the cells of the string, including the cells addressable by $WL_{n−3}$ 710-1 through $WL_{n+3}$ 710-7, are biased to a ground voltage, represented in FIG. 7 as "0 V", to enable the positive charge carriers generated by the drain-side and/or the source-side to travel through the channel. The arrows shown in FIG. 7 illustrate the direction that the positive charge carriers travel through the channel (e.g., pillar) from the respective drain-side and source-side.

Biasing the bitline and/or source line to high voltages (e.g., greater than or equal to 5 V) can result in disturb effects (e.g., erase disturb and/or program disturb). For example, the high positive bias voltage applied to the bitline and/or the source line can cause erase disturb from stress when the cell wordlines are grounded. As another example, a large potential difference between the high positive bias voltage applied to the bitline and/or the source line and the negative voltage of the channel (e.g., pillar) can lead to program disturb caused by hot electron injection.

At least the above-noted disturb effects can be mitigated by minimizing the magnitude of the non-negative bias voltage applied to the bitline and/or the source line, while maximizing the magnitude of the negative bias voltage applied to the SGD 720 and/or the SGS 730. For example, a 3.5 V bias voltage applied to the bitline and a −4 V bias voltage applied to the SGD 720 can generate a similar amount of drain-side GIDL as a 5 V bias voltage applied to the bitline and a −2.5 V bias voltage applied to the SGD, while reducing disturb effects. It may be even more beneficial to ground the bitline and/or the source line (e.g., 0 V) and apply an even higher magnitude negative bias voltage only to the SGD 720 and/or the SGS 730.

Due to memory device size and/or design constraints, it may be impractical or impossible in some implementations to apply such high magnitude negative bias voltages to SGD 720 and/or SGS 730. As will now be described below with reference to FIGS. 8-9, in some embodiments, GIDL can be realized on a single side of the memory array (e.g., drain-side or source-side), depending on the location of the WL selected for the program refresh operation, in a manner that reduces disturb effects (e.g., erase disturb and/or program disturb).

FIG. 8 is a diagram illustrating an example of program refresh with all levels program operation integrated with gate-induced drain leakage (GIDL) seeds implemented for a portion of an array of memory cells ("portion") 800, in accordance with some embodiments of the present disclosure. More specifically, the portion 800 can correspond to cells addressable by (e.g., connected to) a particular bitline (not shown) of the array.

As shown, the portion 800 includes a string of cells addressable by (e.g., connected to) respective wordlines (WLs). The WLs include $WL_{n-5}$ 810-1 through $WL_{n+1}$ 810-7. For example, cell 812 is addressable by $WL_n$ 810-6. In this example, $WL_n$ 810-6 is a wordline selected for program refresh. The portion 800 further includes a drain-side select gate (SGD) 820 and a source-side select gate (SGS) 830. Although not shown in FIG. 8, the portion 800 further includes a common source line connected to SGS 830, similar to SRC 216 described above with reference to FIG. 2A.

In this illustrative example, the WLs of the memory array can be divided into a drain-side group of WLs and a source-side group of WLs. More specifically, the drain-side group of WLs includes $WL_n$ 810-6 and each of the WLs closer to SGD 820 relative to $WL_n$ 810-6 (e.g., $WL_{n+1}$ 810-7). The source-side group of WLs includes each of the WLs closer to SGS 830 relative to $WL_n$ 810-6 (e.g., $WL_{n-5}$ 810-1 through $WL_{n-1}$ 810-5). Accordingly, $WL_n$ 810-6 separates the drain-side group of WLs from the source-side group of WLs.

In this illustrative example, GIDL is realized from the drain-side only. For example, to cause GIDL on the drain-side, the bitline can be biased to a voltage "$V_1$" and SGD 820 can be biased to a voltage "$V_2$". The difference between $V_1$ and $V_2$ defines the amount of GIDL from the drain-side and thus the amount of positive charge carriers (e.g., holes) that are generated on the drain-side. In some embodiments, $V_1$ is a non-negative voltage and $V_2$ is a non-positive voltage. For example, $V_1$ can range from about 0 V to about 5 V, and $V_2$ can range from about −5 V to about 0 V. In an embodiment, $V_1$ can be about 5 V and $V_2$ can be about −2.5 V.

The cells addressable by the WLs of the drain-side group (including cell 812) are biased to ground (represented in FIG. 8 as "0 V") to enable the positive charge carriers generated by the drain-side to travel through the channel. The arrow shown in FIG. 8 illustrates the direction that the positive charge carriers travel through the channel (e.g., pillar) from the drain-side. To reduce disturb effects (e.g., erase disturb and/or program disturb), the cells addressable by the WLs of the source-side group can be biased to a non-ground voltage "$V_3$". In some embodiments, $V_3$ is a negative voltage. For example, $V_3$ can be a negative voltage having a magnitude equal to the magnitude of $V_1$.

FIG. 9 is a diagram illustrating an example of program refresh with gate-induced drain leakage (GIDL) seeds implemented for a portion of an array of memory cells ("portion") 900, in accordance with some embodiments of the present disclosure. More specifically, the portion 900 can correspond to cells addressable by (e.g., connected to) a particular bitline (not shown) of the array.

As shown, the portion 900 includes a string of cells addressable by (e.g., connected to) respective wordlines (WLs). The WLs include $WL_{n-1}$ 910-1 through $WL_{n+5}$ 910-7. For example, cell 912 is addressable by $WL_n$ 910-6. In this example, $WL_n$ 910-6 is a wordline selected for program refresh. The portion 900 further includes a drain-side select gate (SGD) 920 and a source-side select gate (SGS) 930. Although not shown in FIG. 9, the portion 900 further includes a common source line connected to SGS 930, similar to SRC 216 described above with reference to FIG. 2A.

In this illustrative example, the WLs of the memory array can be divided into a source-side group of WLs and a drain-side group of WLs. More specifically, the source-side group of WLs includes $WL_n$ 910-2 and each of the WLs closer to SGS 920 relative to $WL_n$ 910-2 (e.g., $WL_{n-1}$ 910-1). The drain-side group of WLs includes each of the WLs closer to SGD 430 relative to $WL_n$ 910-2 (e.g., $WL_{n+1}$ 910-3 through $WL_{n+51}$ 910-7). Accordingly, $WL_n$ 910-2 separates the source-side group of WLs from the drain-side group of WLs.

In this illustrative example, GIDL is being caused on the source-side only. For example, to cause GIDL on the source-side, the source line can be biased to a voltage "$V_1$" and SGS 920 can be biased to a voltage "$V_2$". The difference between $V_1$ and $V_2$ defines the amount of GIDL caused on the source-side and thus the amount of positive charge carriers (e.g., holes) that are generated on the source-side. In some embodiments, $V_1$ is a non-negative voltage and $V_2$ is a non-positive voltage. For example, $V_1$ can range from about 0 V to about 5 V, and $V_2$ can range from about −5 V to about 0 V. In an embodiment, $V_1$ can be about 5 V and $V_2$ can be about −2.5 V.

The cells addressable by the WLs of the source-side group (including cell 912) are biased to ground (represented in FIG. 9 as "0 V") to enable the positive charge carriers generated by the drain-side to travel through the channel (e.g., pillar). The arrow shown in FIG. 9 illustrates the direction that the positive charge carriers travel through the channel from the source-side. To reduce disturb effects (e.g., erase disturb and/or program disturb), the cells addressable by the WLs of the drain-side group can be biased to a non-ground voltage "$V_3$". In some embodiments, $V_3$ is a negative voltage. For example, $V_3$ can be a negative voltage having a magnitude equal to (or approximately equal to) the magnitude of $V_1$.

FIG. 10 is a flow diagram of an example method 1000 for causing gate-induced drain leakage (GIDL) in a memory array, in accordance with some embodiments of the present disclosure. For example, the method 1000 can be performed during operation 330 of FIG. 3A. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by local media controller 135 and/or PR component 137 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, GIDL current is generated with respect to at least one string of cells of a memory array. For example, control logic (e.g., local media controller 135) can cause a set of bias voltages to be applied with respect to the least one string of cells to generate the GIDL current. The GIDL current generated by the set of bias voltages can generate positive charge carriers (e.g., holes) that can travel through the channel.

For example, the set of bias voltages can include a first bias voltage applied to the bitline connected to the at least one string of cells and a second bias voltage applied to the drain-side select gate (SGD) connected to the at least one string of cells. The first bias voltage and the second bias voltage can generate the GIDL current from the drain-side of the memory array ("drain-side GIDL") that can travel toward the source-side of the memory array. The difference between these bias voltages defines the amount of drain-side GIDL and thus the amount of positive charge carriers that are generated on the drain-side. In some embodiments, the first bias voltage is a non-negative voltage and the second bias voltage is a non-positive voltage. For example, the first bias voltage can range from about 0 V to about 5 V, and the second bias voltage can range from about −5 V to about 0 V. In an embodiment, the first bias voltage can be about 5 V and the second bias voltage can be about −2.5 V.

Additionally, or alternatively, the set of bias voltages can include a third bias voltage applied to the source line connected to the at least one string of cells and a fourth bias voltage applied to the source-side select gate (SGS) connected to the at least one string of cells. The third bias voltage and the fourth bias voltage can generate the GIDL current from the source-side of the memory array ("source-side GIDL") that can travel toward the drain-side of the memory array. The difference between these bias voltages defines the amount of source-side GIDL and thus the amount of positive charge carriers that are generated on the source-side. In some embodiments, the third bias voltage is a non-negative voltage and the fourth bias voltage is a non-positive voltage. For example, the third bias voltage can range from about 0 V to about 5 V, and the fourth bias voltage can range from about −5 V to about 0 V. In an embodiment, the third bias voltage can be about 5 V and the fourth bias voltage can be about −2.5 V. In some embodiments, the first bias voltage is equal to the third bias voltage. In some embodiment, the second bias voltage is equal to the fourth bias voltage. In some embodiments, the first bias voltage is different from the third bias voltage. In some embodiments, the second bias voltage is different from the fourth bias voltage.

Biasing the bitline and/or source line to high voltages (e.g., greater than or equal to 5 V) can result in disturb effects (e.g., erase disturb and/or program disturb). For example, the high positive bias voltage applied to the bitline and/or the source line can cause erase disturb from stress when the cell wordlines are grounded. As another example, a large potential difference between the high positive bias voltage applied to the bitline and/or the source line and the negative voltage of the channel (e.g., pillar) can lead to program disturb caused by hot electron injection.

At least the above-noted disturb effects can be mitigated by minimizing the magnitude of the non-negative bias voltage applied to the bitline and/or the source line, while maximizing the magnitude of the negative bias voltage applied to the SGD and/or the SGS. For example, a 3.5 V bias voltage applied to the bitline and a −4 V bias voltage applied to the SGD can generate a similar amount of drain-side GIDL as a 5 V bias voltage applied to the bitline and a −2.5 V bias voltage applied to the SGD, while reducing disturb effects. It may be even more beneficial to ground the bitline and/or the source line (e.g., 0 V) and apply an even higher magnitude negative bias voltage only to the SGD and/or the SGS.

At operation 1020, positive charge carrier transport is enabled through the at least one string. For example, control logic can cause a grounding voltage (e.g., about 0 V) to be applied to a set of wordlines to ground cells of the at least one string addressable by the wordlines of the set of wordlines. In some embodiments, the set of wordlines includes all of the wordlines of the memory array, and all of the cells of the at least one string are grounded.

Due to memory device size and/or design constraints, it may be impractical or impossible in some implementations to apply such high magnitude negative bias voltages to the SGD and/or the SGS. In some embodiments, GIDL can be realized on a single side of the memory array (e.g., drain-side or source-side), depending on the location of the wordline selected for the program refresh operation, in a manner that reduces disturb effects (e.g., erase disturb and/or program disturb).

For example, the drain-side only embodiment can be used in the event that the wordline selected for the program refresh operation is closer to the drain-side of the memory array (e.g., closer to the SGD). Here, the first and second bias voltages applied to the bitline and the SGD, respectively, can be similar to those described above. However, control logic can cause the grounding voltage to be applied to the source line and the SGS. Moreover, for the at least one string of cells, the wordlines can be divided into a drain-side group and a source-side group. The drain-side group includes the wordline selected for the program refresh operation and any additional wordlines that are closer to the drain-side of the memory array than the selected wordline. The source-side group includes the remaining wordlines.

The drain-side group of wordlines in this example defines the set of wordlines to which the grounding voltage is applied. More specifically, control logic can cause the grounding voltage to be applied to the wordlines of the drain-side group to ground the cells addressable by the wordlines of the drain-side group. Control logic can cause a fifth bias voltage to be applied to the wordlines of the source-side group to bias the cells addressable by the wordlines of the source-side group. In some embodiments, the fifth bias voltage is a negative voltage. For example, the fifth bias voltage can be a negative voltage having a magnitude equal to the magnitude of the first bias voltage.

As another example, the source-side only embodiment can be used in the event that the wordline selected for the program refresh operation is closer to the source-side of the memory array (e.g., closer to the SGS). Here, the third and fourth bias voltages applied to the source line and the SGS, respectively, can be similar to those described above. However, control logic can cause the grounding voltage to be applied to the bitline and the SGD. Moreover, for the at least one string of cells, the wordlines can be divided into a source-side group and a drain-side group. The source-side group includes the wordline selected for the program refresh operation and any additional wordlines that are closer to the source-side than the selected wordline. The drain-side group includes the remaining wordlines.

The source-side group of wordlines in this example defines the set of wordlines to which the grounding voltage is applied. Control logic can cause the grounding voltage to be applied to the wordlines of the source-side group to ground the cells addressable by the wordlines of the source-side group. Control logic can cause the fifth bias voltage to be applied to the wordlines of the drain-side group to bias the cells addressable by the wordlines of the drain-side group.

Figures 11A, 11B:
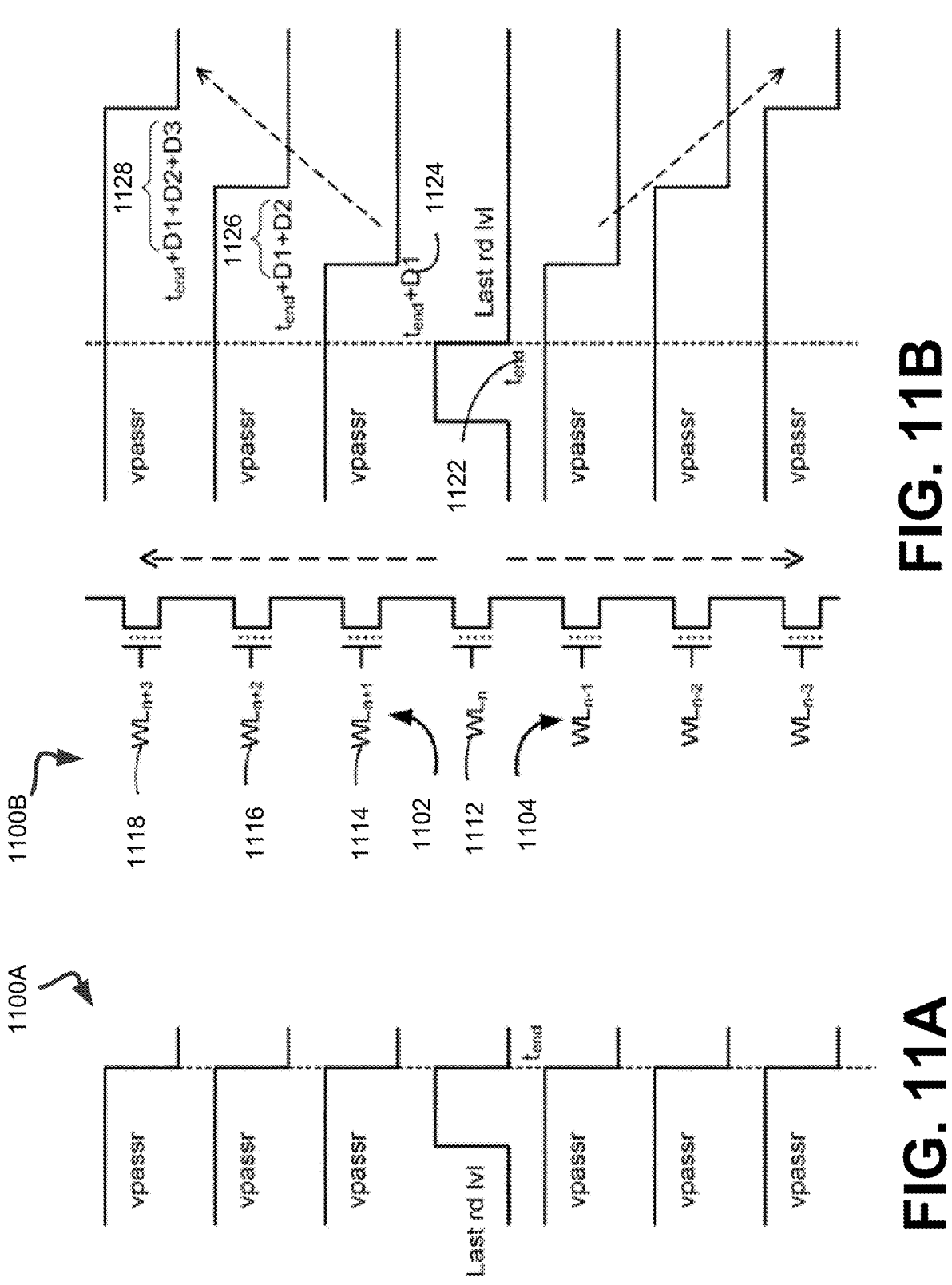
FIG. 11A illustrates a discharge operation in accordance with some embodiments of the present disclosure.
FIG. 11B illustrates a staggered discharge operation in accordance with some embodiments of the present disclosure.

FIG. 11A is an illustration of a simultaneous discharge operation 1100A in accordance with an embodiment of the present technology. In comparison to the simultaneous discharge operation 1100A, FIG. 11B is an illustration of a staggered discharge operation 1100B in accordance with an embodiment of the present technology. Referring to FIG. 11A and FIG. 11B together, the discharge operations 1100A and 1100B can correspond to operations for discharging voltage at the end of a program verify (or read) operation. FIG. 11A and FIG. 11B illustrate an example of removing corresponding voltage at the end of performing a program verify (or read) operation at a selected wordline WLn and at WLs WLn+1, WLn+2, etc. and/or WLn−1, WLn−2, etc. physically adjacent to WLn. Accordingly, FIG. 11A and FIG. 11B illustrate last read voltage (last rd lvl) for the selected wordline WLn and positive pass-gate read voltages (vpassr) for the other WLs.

In some embodiments, the PR component 137 (and/or the local media controller 135) of the memory device 130 can perform the simultaneous discharge operation 1100A and simultaneously/concurrently discharge the related WLs (e.g., WLn, along with WLn+1, WLn+2, etc. and/or WLn−1, WLn−2, etc.), such as at $t_{end}$. In other embodiments, the PR component 137 (and/or the local media controller 135) can control the discharge timings of the related WLs and perform the staggered discharge operation 1100B. For example, when the read operation ends with a pulse at a selected WL 1112 at a reference time 1122 (tend), the PR component 137 (and/or the local media controller 135) can delay the discharge timings of other related/adjacent WLs. For the example illustrated in FIG. 11B, the PR component 137 (and/or the local media controller 135) can discharge one or more first/immediately adjacent WLs 1114 (e.g., WLn+1 and/or WLn−1) after a first delay 1124 (D1). The discharge controller 254 can discharge one or more second/next proximate WLs 1116 (e.g., WLn+2 and/or WLn−2) after a second delay 1126 (D1+D2) that is greater than the first delay 1124. Similarly, the PR component 137 (and/or the local media controller 135) can discharge one or more third/next proximate WLs 1118 (e.g., WLn+3 and/or WLn−3) after a third delay 1128 (D1+D2+D3) that is greater than each of the first delay 1124 and the second delay 1126. The PR component 137 (and/or the local media controller 135) can use the staggered discharge operation 1100B during (e.g., at the end of reads/probes) the program verify operation 350 of FIG. 3A.

The PR component 137 (and/or the local media controller 135) can perform the staggered discharge operation 1100B across a predetermined number (e.g., a set of one to five adjacent WLs on each side) of WLs. Moreover, the PR component 137 (and/or the local media controller 135) can perform the staggered discharge operation 1100B across one or more sides of WLs relative to the selected WL 1112. In some embodiments, the differences between the first delay 1124, the second delay 1126, and the third delay 1128 can be identical (e.g., D1=D2=D3). In other embodiments, the differences between the delays can be different or dynamically adjusted. Additionally, or alternatively, in some embodiments, the PR component 137 (and/or the local media controller 135) can perform the staggered discharge operation 1100 across WLs on multiple/both sides, such as a first side WLs 1102 and a second side WLs 1104. The staggered discharge operation 1100B can perform the staggered discharge operation 1100B for matching number of WLs on the multiple/both sides. In other embodiments, the PR component 137 (and/or the local media controller 135) can perform the staggered discharge operation 1100B on one side, such as on either the first side WLs 1102 or the second side WLs 1104. In one or more embodiments, the PR component 137 (and/or the local media controller 135) can selectively perform the staggered discharge operation 1100B on one side, such as when the selected WL 1112 is within a threshold range from a boundary. The memory system 202 can use the staggered discharge operation 1100B to ensure that the potential at the selected WL 1112 returns to electrical ground. The staggered discharge operation 1100B can be used to shorten the discharge window for each WL.

FIG. 12 is a flow diagram of an example method 1200 for causing wordline staggered discharge (WSD) program verify operation performed in a memory array, in accordance with some embodiments of the present disclosure. For example, the method 1200 can be performed during operation 350 of FIG. 3A. The method 1200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1200 is performed by local media controller 135 and/or PR component 137 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1210, the processing device may cause a discharging of voltage on the selected wordline. In some implementations, the processing device may cause a staggered discharge operation performed at a reference time.

At operation 1220, the processing device may determine one or more timing delays and cause a discharging of voltage on surrounding wordlines of the selected wordline at the one or more timing delays. In some implementations, the processing device may discharge surrounding wordlines at different times following the reference time for ensuring that a pillar potential returns to a reset level. In some implementations, the processing device may discharge one or more first adjacent wordlines physically located directly adjacent to the selected wordline following a first delay measured from the reference time. In some implementations, the processing device may discharge one or more second adjacent wordlines physically located directly adjacent to the one or more first adjacent wordlines opposite the selected wordline, wherein the one or more second adjust wordlines are discharged after a second delay measured from the reference time, and wherein the second delay is greater than the first delay. In some implementations, the surrounding wordlines comprise wordlines physically located on one side of and adjacent to the selected wordline. In some implementations, the processing device may ignore wordlines on a second side opposite the surrounding wordlines when the selected wordline is within a threshold number of wordlines from a boundary on the second side.

Figure 13:
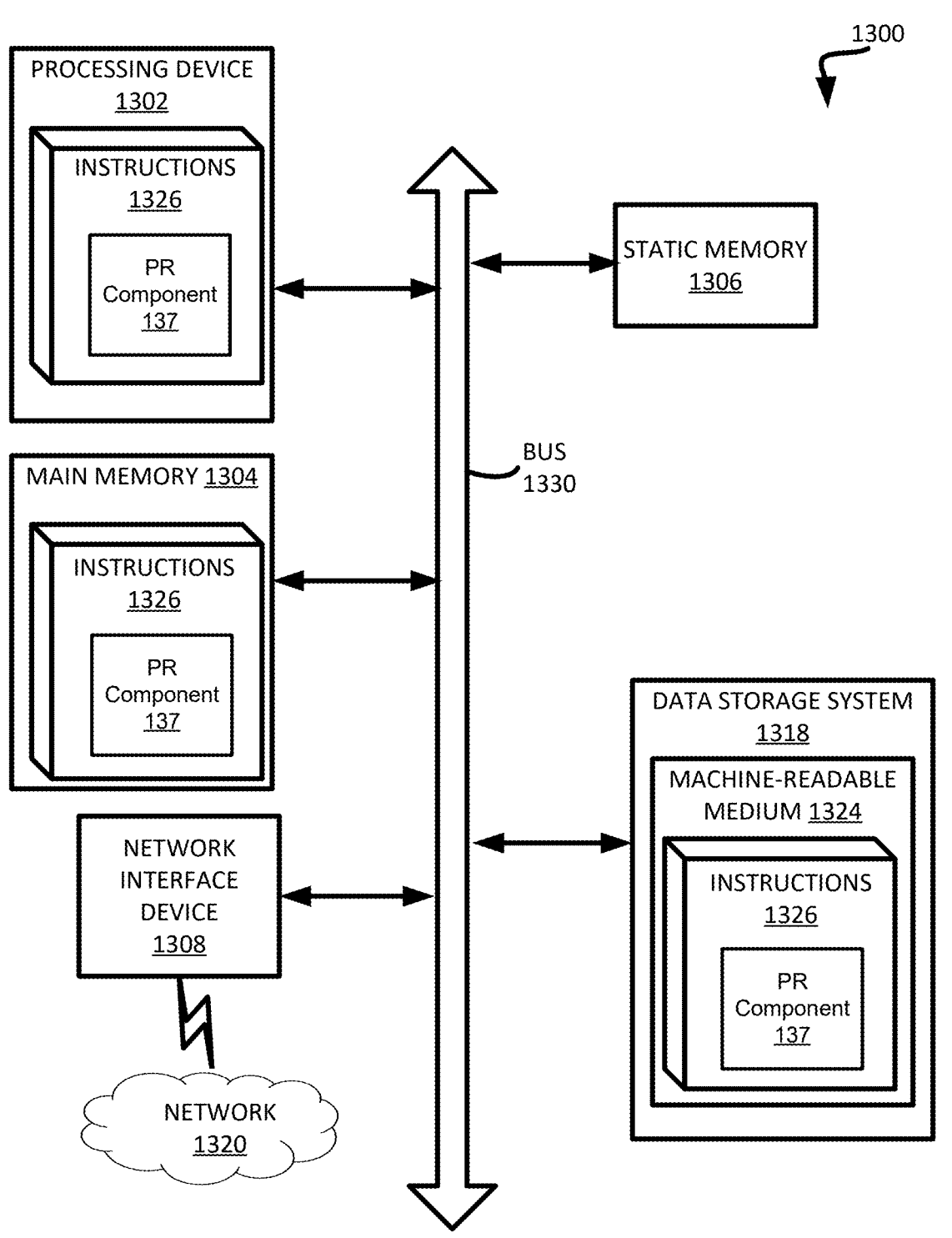
FIG. 13 is a block diagram of an example computer system in which embodiments of the present disclosure can operate.

FIG. 13 illustrates an example machine of a computer system 1300 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 and/or the PR component 137 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM) or RDRAM, etc.), a static memory 1306 (e.g., flash memory, static random access memory (SRAM), etc.), and a data storage system 1318, which communicate with each other via a bus 1330.

Processing device 1302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 can also be one or more special-purpose processing devices such as an application specific integrated circuit (ASIC), a field programmable gate array (FPGA), a digital signal processor (DSP), network processor, or the like. The processing device 1302 is configured to execute instructions 1326 for performing the operations and steps discussed herein. The computer system 1300 can further include a network interface device 1308 to communicate over the network 1320.

The data storage system 1318 can include a machine-readable storage medium 1324 (also known as a computer-readable medium) on which is stored one or more sets of instructions 1326 or software embodying any one or more of the methodologies or functions described herein. The instructions 1326 can also reside, completely or at least partially, within the main memory 1304 and/or within the processing device 1302 during execution thereof by the computer system 1300, the main memory 1304 and the processing device 1302 also constituting machine-readable storage media. The machine-readable storage medium 1324, data storage system 1318, and/or main memory 1304 can correspond to the memory sub-system 110 of FIG. 1A.

In one embodiment, the instructions 1326 include instructions to implement functionality corresponding to a local media controller and/or PR component (e.g., the local media controller 135 and/or the PR component 137 of FIG. 1A). While the machine-readable storage medium 1324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array comprising:
        a plurality of wordlines; and
        at least one string of cells, each cell of the at least one string of cells being addressable by a respective wordline of the plurality of wordlines; and
    control logic, operatively coupled with the memory array, to perform operations comprising:
    initializing a loop of a program refresh operation;
    causing a set of memory cells addressable by a selected wordline, of the plurality of wordlines, to be programmed during the loop by:
        causing, during a first time period of a program operation, a seed operation to be performed on the set of memory cells;
        causing, during a second time period of the program operation, a ramping wordline voltage to be applied to the set of memory cells of the selected wordline;
        causing, during the second time period, a disconnection of a set of pillars associated with the set of memory cells from a voltage supply and a ground voltage, wherein each pillar corresponds to a respective programming level of a set of programming levels;
        causing, during a third time period of the program operation, a program pulse to be applied to the set of memory cells, wherein the program pulse programs each programming level of the set of programming levels associated with the set of memory cells; and
        causing, during a program verify time period of the program operation, a program verify operation performed on the set of memory cells.

2. The memory device of claim 1, wherein causing the seed operation to be performed on the set of memory cells comprises:
    generating a gate-induced drain leakage (GIDL) current with respect to the at least one string of cells; and
    causing a grounding voltage to be applied to a set of wordlines of the plurality of wordlines to ground each cell of the at least one string of cells addressable by each wordline of the set of wordlines, wherein the grounding voltage applied to the set of wordlines enables transport of positive charge carriers generated by the GIDL current.

3. The memory device of claim 2, wherein generating the GIDL current comprises causing a set of bias voltages to be applied with respect to the at least one string of cells, wherein the at least one string of cells is connected to a bitline and a drain-side select gate (SGD), and wherein the set of bias voltages comprises a non-negative bias voltage applied to the bitline and a non-positive bias voltage applied to the SGD to generate drain-side GIDL.

4. The memory device of claim 2, wherein generating the GIDL current comprises causing a set of bias voltages to be applied with respect to the at least one string of cells, wherein the at least one string of cells is connected to a source-side select gate (SGS) and a source line, and wherein the set of bias voltages comprises a non-negative bias voltage applied to the source line and a non-positive bias voltage applied to the SGS to generate source-side GIDL.

5. The memory device of claim 1, wherein the program verify operation comprises a staggered discharge operation performed at a reference time.

6. The memory device of claim 5, wherein the staggered discharge operation comprises discharging surrounding wordlines at different times following the reference time for ensuring that a pillar potential returns to a reset level.

7. The memory device of claim 6, wherein discharging the surrounding wordlines comprises discharging one or more first adjacent wordlines physically located directly adjacent to the selected wordline following a first delay measured from the reference time.

8. The memory device of claim 7, wherein discharging the surrounding wordlines comprises discharging one or more second adjacent wordlines physically located directly adjacent to the one or more first adjacent wordlines opposite the selected wordline, wherein the one or more second adjacent wordlines are discharged after a second delay measured from the reference time, and wherein the second delay is greater than the first delay.

9. The memory device of claim 6, wherein the surrounding wordlines comprise wordlines physically located on one side of and adjacent to the selected wordline.

10. The memory device of claim 9, further comprising:
    ignoring wordlines on a second side opposite the surrounding wordlines when the selected wordline is within a threshold number of wordlines from a boundary on the second side.

11. The memory device of claim 1, wherein the program refresh operation is performed with respect to the selected wordline of the plurality of wordlines.

12. The memory device of claim 1, wherein the operations further comprise:

determining whether the loop is a final loop based on a result of the program verify operation; and in response to determining that the loop is not the final loop, causing the seed operation to be performed.

13. A method comprising:

initializing, by a processing device coupled with a memory array, a loop of a program refresh operation, wherein the memory array comprises a plurality of wordlines and at least one string of cells, each cell of the at least one string of cells being addressable by a respective wordline of the plurality of wordlines;

causing a set of memory cells addressable by a selected wordline, of the plurality of wordlines, to be programmed during the loop by:

causing, during a first time period of a program operation, a seed operation to be performed on the set of memory cells;

causing, during a second time period of the program operation, a ramping wordline voltage to be applied to the set of memory cells of the selected wordline;

causing, during the second time period, a disconnection of a set of pillars associated with the set of memory cells from a voltage supply and a ground voltage, wherein each pillar corresponds to a respective programming level of a set of programming levels;

causing, during a third time period of the program operation, a program pulse to be applied to the set of memory cells, wherein the program pulse programs each programming level of the set of programming levels associated with the set of memory cells; and causing, during a program verify time period of the program operation, a program verify operation performed on the set of memory cells.

14. The method of claim 13, wherein causing the seed operation to be performed on the set of memory cells comprises:

generating gate-induced drain leakage (GIDL) current with respect to the at least one string of cells; and causing a grounding voltage to be applied to a set of wordlines of the plurality of wordlines to ground each cell of the at least one string of cells addressable by each wordline of the set of wordlines, wherein the grounding voltage applied to the set of wordlines enables transport of positive charge carriers generated by the GIDL current.

15. The method of claim 13, wherein the program verify operation comprises a staggered discharge operation performed at a reference time.

16. The method of claim 13, further comprising:

determining whether the loop is a final loop based on a result of the program verify operation; and in response to determining that the loop is not the final loop, causing the seed operation to be performed.

17. A non-transitory computer readable medium comprising instructions, which when executed by a processing device coupled with a memory array, cause the processing device to perform operations comprising:

initializing a loop of a program refresh operation, wherein the memory array comprises a plurality of wordlines and at least one string of cells, each cell of the at least one string of cells being addressable by a respective wordline of the plurality of wordlines;

causing a set of memory cells addressable by a selected wordline, of the plurality of wordlines, to be programmed during the loop by:

causing, during a first time period of a program operation, a seed operation to be performed on the set of memory cells;

causing, during a second time period of the program operation, a ramping wordline voltage to be applied to the set of memory cells of the selected wordline;

causing, during the second time period, a disconnection of a set of pillars associated with the set of memory cells from a voltage supply and a ground voltage, wherein each pillar corresponds to a respective programming level of a set of programming levels;

causing, during a third time period of the program operation, a program pulse to be applied to the set of memory cells, wherein the program pulse programs each programming level of the set of programming levels associated with the set of memory cells; and causing, during a program verify time period of the program operation, a program verify operation performed on the set of memory cells.

18. The non-transitory computer readable medium of claim 17, wherein causing the seed operation to be performed on the set of memory cells comprises:

generating gate-induced drain leakage (GIDL) current with respect to the at least one string of cells; and causing a grounding voltage to be applied to a set of wordlines of the plurality of wordlines to ground each cell of the at least one string of cells addressable by each wordline of the set of wordlines, wherein the grounding voltage applied to the set of wordlines enables transport of positive charge carriers generated by the GIDL current.

19. The non-transitory computer readable medium of claim 17, wherein the program verify operation comprises a staggered discharge operation performed at a reference time.

20. The non-transitory computer readable medium of claim 17, wherein the operations further comprise:

determining whether the loop is a final loop based on a result of the program verify operation; and in response to determining that the loop is not the final loop, causing the seed operation to be performed.

* * * * *